US011329092B2

(12) United States Patent
Sugiyama

(10) Patent No.: US 11,329,092 B2
(45) Date of Patent: May 10, 2022

(54) SEMICONDUCTOR DEVICE, MANUFACTURING METHOD OF SEMICONDUCTOR DEVICE, AND ELECTRONIC EQUIPMENT

(71) Applicant: SONY SEMICONDUCTOR SOLUTIONS CORPORATION, Kanagawa (JP)

(72) Inventor: Tomohiro Sugiyama, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 48 days.

(21) Appl. No.: 16/650,045

(22) PCT Filed: Sep. 18, 2018

(86) PCT No.: PCT/JP2018/034352
§ 371 (c)(1),
(2) Date: Mar. 24, 2020

(87) PCT Pub. No.: WO2019/069669
PCT Pub. Date: Apr. 11, 2019

(65) Prior Publication Data
US 2020/0235155 A1 Jul. 23, 2020

(30) Foreign Application Priority Data
Oct. 2, 2017 (JP) .............................. JP2017-192395

(51) Int. Cl.
*H01L 27/146* (2006.01)
(52) U.S. Cl.
CPC .... *H01L 27/14636* (2013.01); *H01L 27/1469* (2013.01); *H01L 27/14634* (2013.01)

(58) Field of Classification Search
CPC ............ H01L 21/768; H01L 21/76831; H01L 21/76898; H01L 23/31; H01L 23/48;
(Continued)

(56) References Cited

U.S. PATENT DOCUMENTS

| 2012/0104563 | A1* | 5/2012 | Saito | ................. H01L 21/76898 257/621 |
| 2014/0073129 | A1* | 3/2014 | Kato | ..................... H01L 23/481 438/652 |
| 2017/0005128 | A1 | 1/2017 | Sasaki | |

FOREIGN PATENT DOCUMENTS

| CN | 105814670 A | 7/2016 |
| CN | 108701615 A | 10/2018 |

(Continued)

OTHER PUBLICATIONS

International Search Report and Written Opinion of PCT Application No. PCT/JP2018/034352, dated Dec. 25, 2018, 08 pages of ISRWO.

*Primary Examiner* — Chuong A Luu
(74) *Attorney, Agent, or Firm* — Chip Law Group

(57) ABSTRACT

The present disclosure relates to a semiconductor device, a manufacturing method of the semiconductor device, and electronic equipment that are directed to improving quality and reliability of a semiconductor device including a through electrode, or electronic equipment. The semiconductor device includes a first semiconductor substrate including a through electrode, a first insulating film laminated on a first surface of the first semiconductor substrate, and a second insulating film laminated on the first insulating film, in which an inner wall and a bottom surface of the through electrode are covered with a conductor, the first insulating film and the second insulating film are laminated on the conductor, and the through electrode includes a groove which reaches the first insulating film on the bottom (Continued)

surface from the first surface of the first semiconductor substrate. The present technology may be applied to a packaged solid-state imaging device or the like, for example.

12 Claims, 17 Drawing Sheets

(58) Field of Classification Search
CPC ... H01L 23/528; H01L 23/532; H01L 23/525; H01L 23/3114; H01L 23/53295; H01L 27/146; H01L 27/1469; H01L 27/14634; H01L 27/14636; H01L 27/14618; H01L 27/14683; H01L 23/04; H01L 23/52; H01L 2224/11
USPC .......................................................... 257/292
See application file for complete search history.

(56) References Cited

FOREIGN PATENT DOCUMENTS

| | | | |
|---|---|---|---|
| JP | 2002-270714 | A | 9/2002 |
| JP | 2011-222596 | A | 11/2011 |
| JP | 2012-253182 | A | 12/2012 |
| JP | 2017-157751 | A | 9/2017 |
| KR | 10-2016-0098221 | A | 8/2016 |
| TW | 201201342 | A | 1/2012 |
| TW | 201526193 | A | 7/2015 |
| WO | 2007/032213 | A1 | 3/2007 |
| WO | 2011/125935 | A1 | 10/2011 |
| WO | 2015/093313 | A1 | 6/2015 |
| WO | 2017/150343 | A1 | 9/2017 |

* cited by examiner

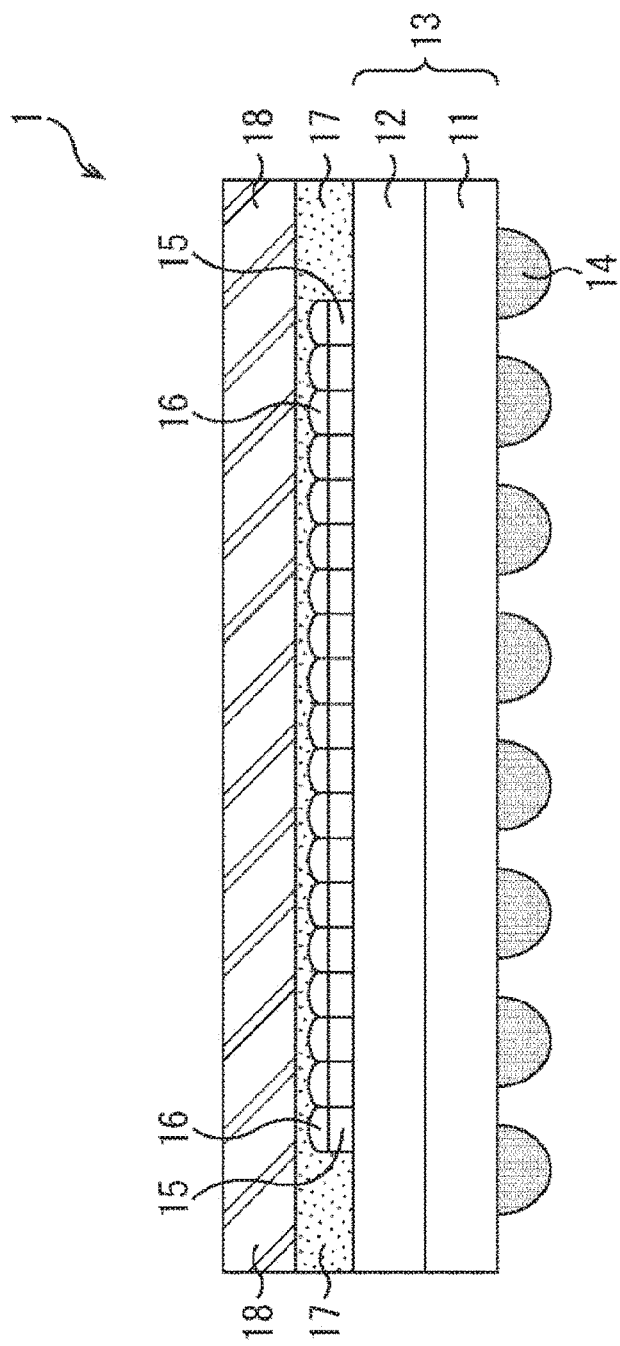

FIG. 9
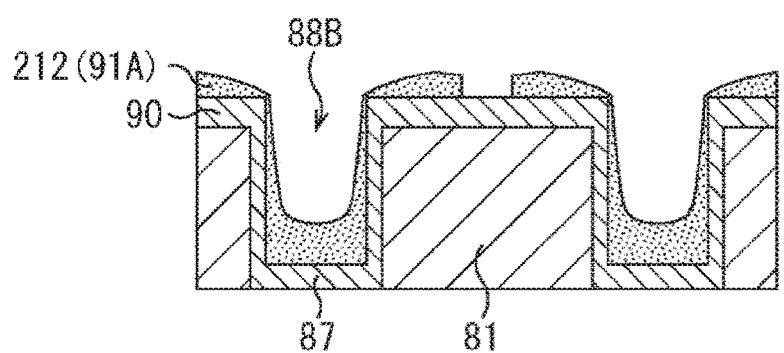
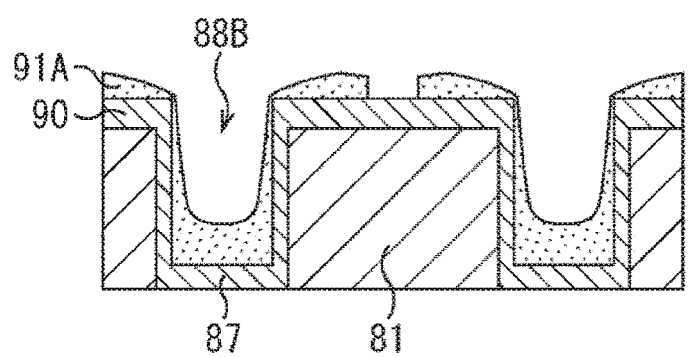

SEMICONDUCTOR DEVICE, MANUFACTURING METHOD OF SEMICONDUCTOR DEVICE, AND ELECTRONIC EQUIPMENT

CROSS REFERENCE TO RELATED APPLICATIONS

This application is a U.S. National Phase of International Patent Application No. PCT/JP2018/034352 filed on Sep. 18, 2018, which claims priority benefit of Japanese Patent Application No. JP 2017-192395 filed in the Japan Patent Office on Oct. 2, 2017. Each of the above-referenced applications is hereby incorporated herein by reference in its entirety.

TECHNICAL FIELD

A technology according to the present disclosure (hereinafter, also referred to as the present technology) relates to a semiconductor device, a manufacturing method of the semiconductor device, and electronic equipment, and, particularly, relates to a semiconductor device including a through electrode, a manufacturing method of the semiconductor device, and electronic equipment.

BACKGROUND ART

In related art, it has been proposed to relax stress such as bending stress in the vicinity of a through electrode, tensile stress, compressive stress and shear stress by a stress relaxing portion which is a portion where a conductor within the through electrode is removed in a groove shape (see, for example, Patent Document 1).

CITATION LIST

Patent Document

Patent Document 1: International Publication No. 2007/032213

SUMMARY OF THE INVENTION

Problems to be Solved by the Invention

However, in Patent Document 1, a measure has not been studied against occurrence of a crack at an insulating film around a through electrode due to stress by swelling and contraction action of the insulating film which protects a conductor within the through electrode and a wiring connected to the through electrode.

The present technology has been made in view of such circumstances and is directed to improving quality and reliability of a semiconductor device including a through electrode, or electronic equipment.

Solutions to Problems

According to a first aspect of the present technology, there is provided a semiconductor device including a first semiconductor substrate including a through electrode, a first insulating film laminated on a first surface of the first semiconductor substrate, and a second insulating film laminated on the first insulating film, in which an inner wall and a bottom surface of the through electrode are covered with a conductor, the first insulating film and the second insulating film are laminated on the conductor, and the through electrode includes a groove which reaches the first insulating film on the bottom surface from the first surface of the first semiconductor substrate.

According to a second aspect of the present technology, there is provided a manufacturing method of a semiconductor device, including a first step of forming a first insulating film on a predetermined surface of a semiconductor substrate and on a conductor which covers an inner wall and a bottom surface of a through electrode of the semiconductor substrate, a second step of forming a second insulating film on the first insulating film, and a third step of forming a groove which reaches the first insulating film on the bottom surface of the through electrode from the predetermined surface of the semiconductor substrate, within the through electrode.

According to a third aspect of the present technology, there is provided electronic equipment including a semiconductor device, and a signal processing unit configured to process a signal output from the semiconductor device, in which the semiconductor device includes a first semiconductor substrate including a through electrode, a first insulating film laminated on a first surface of the first semiconductor substrate, and a second insulating film laminated on the first insulating film, and an inner wall and a bottom surface of the through electrode are covered with a conductor, the first insulating film and the second insulating film are laminated on the conductor, and the through electrode includes a groove which reaches the first insulating film on the bottom surface from the first surface of the first semiconductor substrate.

In the first aspect or the third aspect of the present technology, stress by swelling and contraction action of an insulating film including a first insulating film and a second insulating film is relaxed.

In the second aspect of the present technology, a first insulating film is formed on a predetermined surface of a semiconductor substrate and on a conductor which covers an inner wall and a bottom surface of a through electrode of the semiconductor substrate, a second insulating film is formed on the first insulating film, and a groove which reaches the first insulating film on the bottom surface of the through electrode from the predetermined surface of the semiconductor substrate is formed inside the through electrode.

Effects of the Invention

According to the first to the third aspects of the present technology, it is possible to improve quality and reliability of a semiconductor device including a through electrode, or electronic equipment.

Note that in this connection, the effects described here are not necessarily limited, and may be any of the effects described in the present disclosure.

BRIEF DESCRIPTION OF DRAWINGS

FIG. 1 is an appearance schematic view of a solid-state imaging device of a first embodiment.

FIG. 9 is a view for explaining a manufacturing method of a semiconductor device.

MODE FOR CARRYING OUT THE INVENTION

Figure 2A:
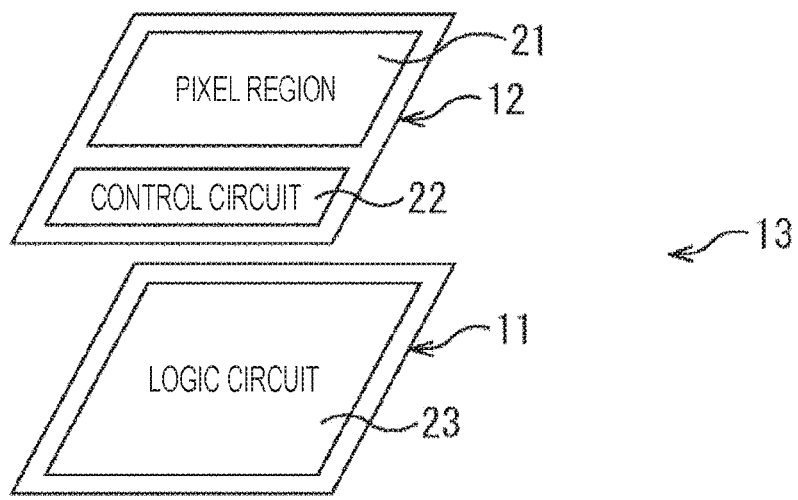
FIGS. 2A and 2B are views explaining a substrate configuration of the solid-state imaging device.

Embodiments for implementing the present disclosure (hereinafter, referred to as embodiments) will be described below. Note that description will be provided in the following order.

1. First embodiment (example where solder mask has two-layer structure)
2. Second embodiment (example where solder mask has three-layer structure)
3. Application examples
4. Modified examples «1. First Embodiment»

A first embodiment of the present technology will be described first with reference to FIG. 1 to FIG. 10.

<Appearance Schematic View>

FIG. 1 is an appearance schematic view of a backside irradiation type solid-state imaging device 1 as a semiconductor device according to the first embodiment of the present technology.

The solid-state imaging device 1 illustrated in FIG. 1 is a semiconductor package in which a laminate substrate 13 in which a lower substrate 11 and an upper substrate 12 are laminated is packaged.

On the lower substrate 11, a plurality of solder balls 14 which is a backside electrode for being electrically connected to an external substrate which is not illustrated is formed.

On an upper surface of the upper substrate 12, a color filter 15 of R (red), G (green) or B (blue) and an on-chip lens 16 are formed. Further, the upper substrate 12 is connected to a glass protection substrate 18 for protecting the on-chip lens 16 via a glass seal resin 17 in a cavity-less structure.

For example, as illustrated in FIG. 2A, on the upper substrate 12, a pixel region 21 in which pixel portions which perform photoelectric conversion are arranged in a two-dimensional array, and a control circuit 22 which controls the pixel portions, are formed, and, on the lower substrate 11, a logic circuit 23 such as a signal processing circuit which processes pixel signals output from the pixel portions is formed.

Figure 2B:
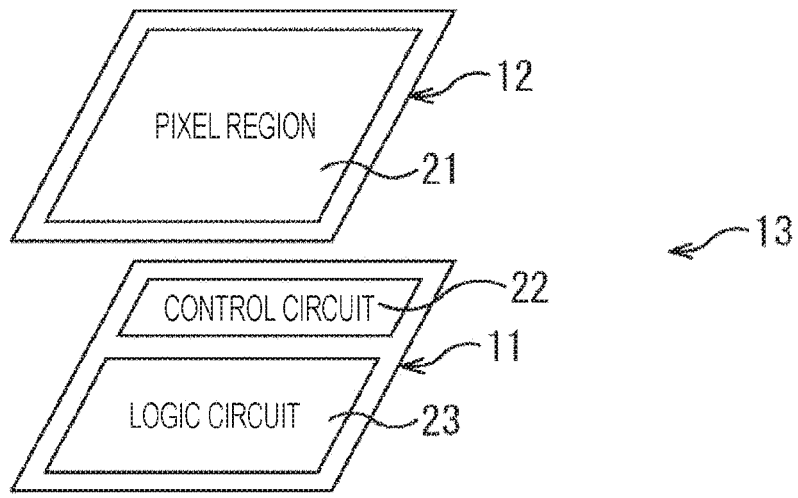

Alternatively, as illustrated in FIG. 2B, it is also possible to employ a configuration where only the pixel region 21 is formed on the upper substrate 12, and the control circuit 22 and the logic circuit 23 are formed on the lower substrate 11.

As described above, by the logic circuit 23 or both the control circuit 22 and the logic circuit 23 being formed and laminated on the lower substrate 11 which is different from the upper substrate 12 of the pixel region 21, it is possible to make a size of the solid-state imaging device 1 smaller than in a case where the pixel region 21, the control circuit 22 and the logic circuit 23 are arranged in a planar direction on one semiconductor substrate.

Description will be provided below while the upper substrate 12 on which at least the pixel region 21 is formed will be referred to as a pixel sensor substrate 12, and the lower substrate 11 on which at least the logic circuit 23 is formed will be referred to as a logic substrate 11.

<Configuration Example of Laminate Substrate>

Figure 3:
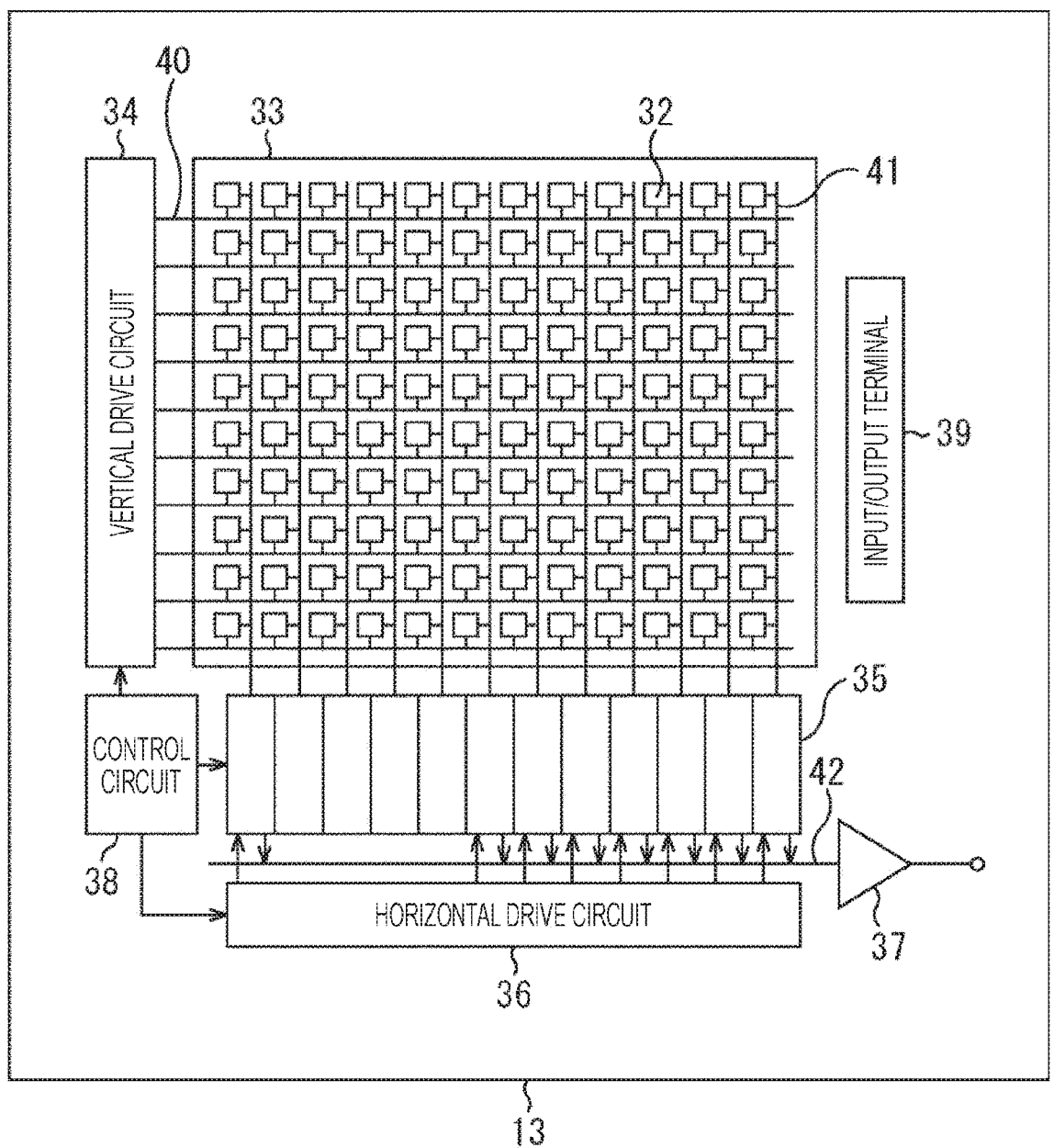
FIG. 3 is a view illustrating a circuit configuration example of a laminate substrate.

FIG. 3 illustrates a circuit configuration example of the laminate substrate 13.

The laminate substrate 13 includes a pixel array portion 33 in which pixels 32 are arranged in a two-dimensional array, a vertical drive circuit 34, a column signal processing circuit 35, a horizontal drive circuit 36, an output circuit 37, a control circuit 38, an input/output terminal 39, or the like.

The pixel 32 includes a photodiode as a photoelectric conversion element, and a plurality of pixel transistors. A circuit configuration example of the pixel 32 will be described later with reference to FIG. 4.

Further, the pixels 32 may also have a shared pixel structure. This shared pixel structure includes a plurality of photodiodes, a plurality of transfer transistors, a shared floating diffusion (a floating diffusion region), and a shared pixel transistor. In other words, in the shared pixel, the photodiodes and the transfer transistors configuring a plurality of unit pixels share another pixel transistor.

The control circuit 38 receives data for instructing an input clock, an operation mode, or the like, and outputs data such as internal information of the laminate substrate 13. In other words, the control circuit 38 generates a clock signal and a control signal serving as a reference of operations of the vertical drive circuit 34, the column signal processing circuits 35, the horizontal drive circuit 36, and the like on the basis of a vertical synchronous signal, a horizontal synchronous signal, and a master clock. Then, the control circuit 38 outputs the generated clock signal and the control signal to the vertical drive circuit 34, the column signal processing circuits 35, the horizontal drive circuit 36, and the like.

The vertical drive circuit 34 is configured with, for example, a shift register, and selects a predetermined pixel driving line 40, supplies pulses for driving the pixels 32 to the selected pixel driving line 40, and drives the pixels 32 in units of rows. In other words, the vertical drive circuit 34 selectively scans the pixels 32 of the pixel array portion 33 sequentially in the vertical direction in units of rows, and supplies pixel signals based on signal charges generated according to an amount of received light in the photoelectric conversion units of the pixels 32 to the column signal processing circuits 35 via a vertical signal line 41.

The column signal processing circuit 35 is arranged for each column of the pixels 32, and performs signal processing such as noise reduction on the signals output from the pixels 32 of one row for each column of pixels. For example, the column signal processing circuit 5 performs signal processing such as correlated double sampling (CDS) for removing pixel-specific fixed pattern noise and AD conversion.

The horizontal drive circuit 36 is configured with, for example, a shift register, and sequentially outputs horizontal scan pulses, sequentially selects the column signal processing circuits 35, and outputs the pixel signals of the column signal processing circuits 35 to a horizontal signal line 42.

The output circuit 37 performs signal processing on the signals sequentially supplied from the column signal processing circuits 35 via the horizontal signal line 42, and outputs resulting data. For example, the output circuit 37 may perform only buffering or may perform various types of digital signal processing such as black level adjustment and column variation correction. An input/output terminal 39 exchanges a signal with the outside.

The laminate substrate 13 having the above configuration is a CMOS image sensor called a column AD system in which the column signal processing circuits 35 performing the CDS process and the AD conversion process are arranged for each column of pixels.

<Circuit Configuration Example of Pixel>

Figure 4:
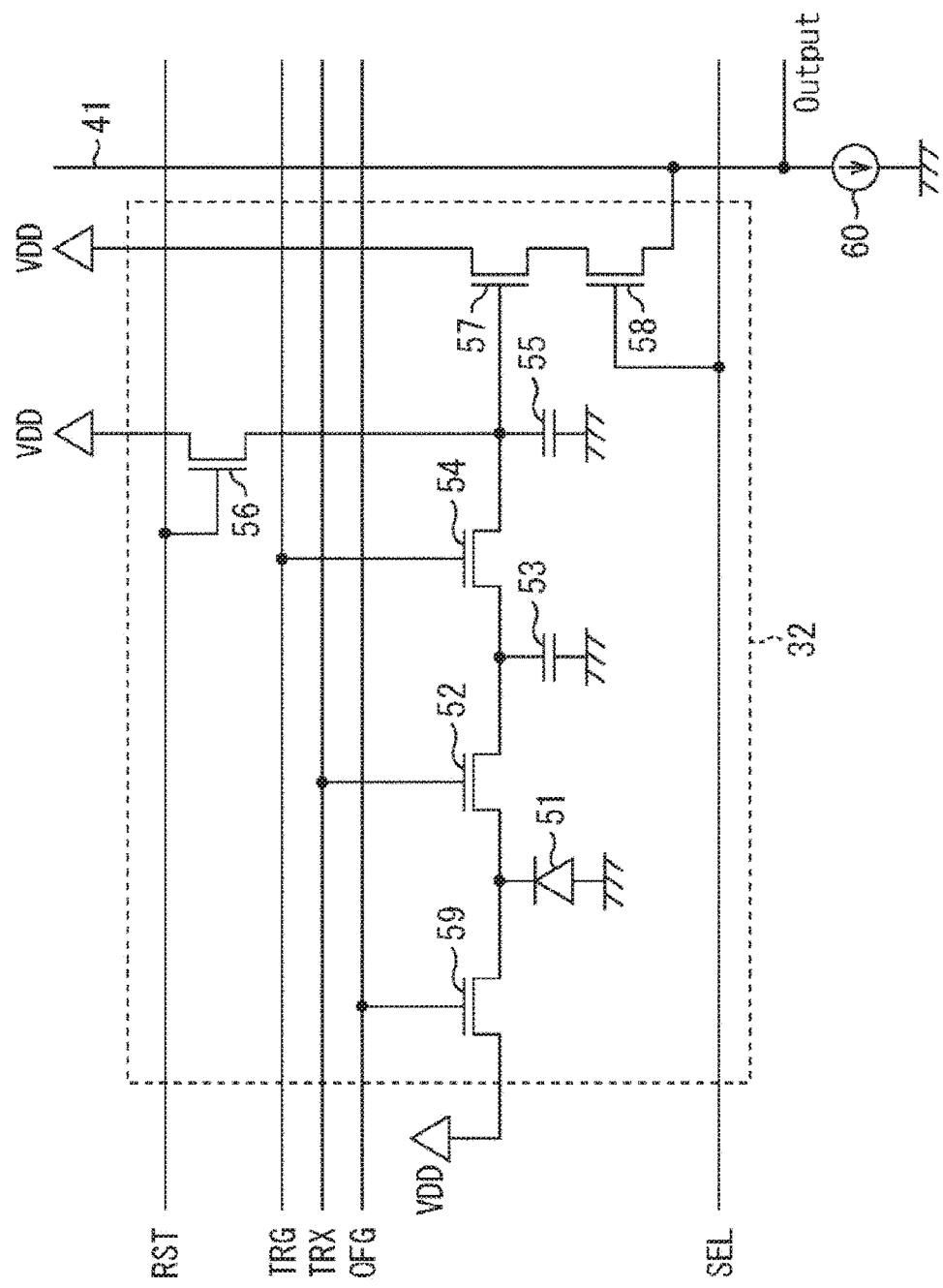
FIG. 4 is a view illustrating an equivalent circuit of a pixel.

FIG. 4 illustrates an equivalent circuit of the pixel 32.

The pixel 32 illustrated in FIG. 4 has a configuration which realizes an electronic global shutter function.

The pixel 32 includes a photodiode 51 as a photoelectric conversion element, a first transfer transistor 52, a memory portion (MEM) 53, a second transfer transistor 54, a floating diffusion region (FD) 55, a reset transistor 56, an amplifier transistor 57, a select transistor 58 and a discharge transistor 59.

The photodiode 51 is a photoelectric conversion portion which generates charge (signal charge) in accordance with a received light amount and accumulates the charge. An anode terminal of the photodiode 51 is grounded, and a cathode terminal is connected to the memory portion 53 via the first transfer transistor 52. Further, the cathode terminal of the photodiode 51 is also connected to the discharge transistor 59 for discharging unnecessary charge.

The first transfer transistor 52 reads out charge generated at the photodiode 51 when the first transfer transistor 52 is turned on by a transfer signal TRX and transfers the charge to the memory portion 53. The memory portion 53 is a charge holding portion which temporarily holds charge until the charge is transferred to the FD 55.

The second transfer transistor 54 reads out the charge held in the memory portion 53 when the second transfer transistor 54 is turned on by a transfer signal TRG and transfers the charge to the FD 55.

The FD 55 is a charge holding portion which holds the charge read out from the memory portion 53 for reading out the charge as a signal. The reset transistor 56 resets potential of the FD 55 by the charge accumulated in the FD 55 being discharged to a constant voltage source VDD when the reset transistor 56 is turned on by a reset signal RST.

The amplifier transistor 57 outputs a pixel signal in accordance with the potential of the FD 55. That is, the amplifier transistor 57 constitutes a load MOS 60 and a source follower circuit as a constant current source, and a pixel signal indicating a level in accordance with the charge accumulated in the FD 55 is output to the column signal processing circuit 35 (FIG. 3) from the amplifier transistor 57 via the select transistor 58. The load MOS 60 is, for example, disposed within the column signal processing circuit 35.

The select transistor 58 is turned on when the pixel 32 is selected by a select signal SEL, and outputs a pixel signal of the pixel 32 to the column signal processing circuit 35 via a vertical signal line 41.

The discharge transistor 59 discharges unnecessary charge accumulated in the photodiode 51 to the constant voltage source VDD when the discharge transistor 59 is turned on by a discharge signal OFG.

The transfer signals TRX and TRG, the reset signal RST, the discharge signal OFG and the select signal SEL are supplied from the vertical drive circuit 34 via a pixel driving line 40.

Operation of the pixel 32 will be briefly described.

First, before exposure is started, the discharge transistor 59 is turned on by the discharge signal OFG of a High level being supplied to the discharge transistor 59, the charge accumulated in the photodiode 51 is discharged to the constant voltage source VDD, and the photodiodes 51 of all the pixels are reset.

After the photodiodes 51 are reset, when the discharge transistor 59 is turned off by the discharge signal OFG of a Low level, exposure is started at all the pixels of the pixel array portion 33.

When a predetermined exposure period determined in advance has elapsed, the first transfer transistor 52 is turned on by the transfer signal TRX in all the pixels of the pixel array portion 33, and the charge accumulated in the photodiode 51 is transferred to the memory portion 53.

After the first transfer transistor 52 is turned off, the charge held in the memory portion 53 of each pixel 32 is sequentially read out to the column signal processing circuit 35 in units of row. In readout operation, the second transfer transistor 54 in the pixel 32 in a row in which readout is performed is turned on by the transfer signal TRG, and the charge held in the memory portion 53 is transferred to the FD 55. Then, by the select transistor 58 being turned on by the select signal SEL, a signal indicating a level in accordance with the charge accumulated in the FD 55 is output from the amplifier transistor 57 to the column signal processing circuit 35 via the select transistor 58.

As described above, the pixel 32 having the pixel circuit in FIG. 4 can perform global shutter type operation (imaging) in which the same exposure period is set in all the pixels of the pixel array portion 33, after exposure is finished, charge is temporarily held in the memory portion 53, and the charge is sequentially read out from the memory portion 53 in units of row.

Note that, the circuit configuration of the pixel 32 is not limited to the configuration illustrated in FIG. 4, and, it is, for example, also possible to employ a circuit configuration where the memory portion 53 is not provided, and so-called rolling shutter type operation is performed.

<Example of Detailed Structure of Laminate Substrate>

Figure 5:
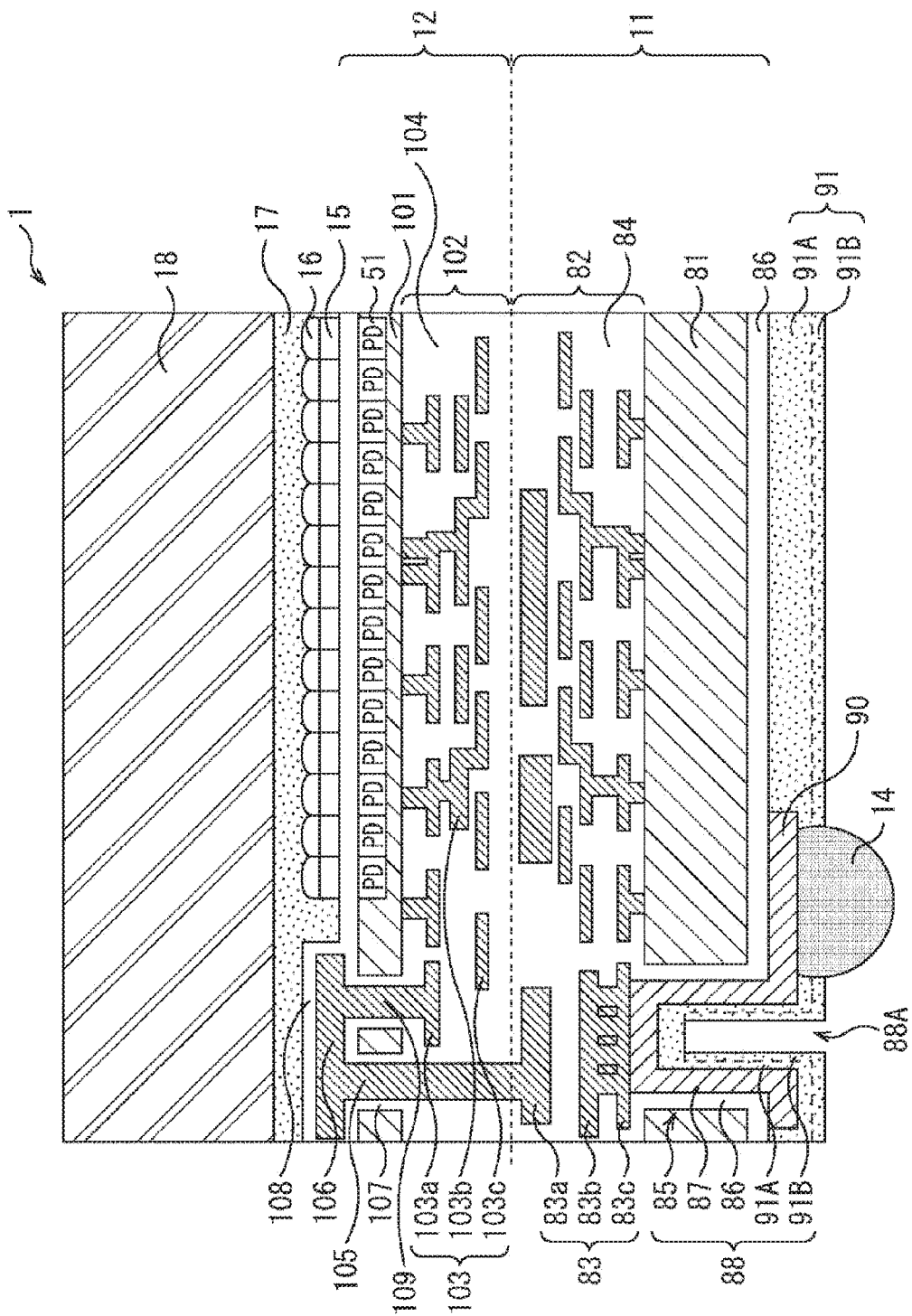
FIG. 5 is a view illustrating a detailed structure of the laminate substrate.

A detailed structure of the laminate substrate 13 will be described next with reference to FIG. 5. FIG. 5 is a cross-sectional enlarged view of a portion of the solid-state imaging device 1.

In the logic substrate 11, for example, a multi-layer wiring layer 82 is formed on an upper side (on a side of the pixel sensor substrate 12) of a semiconductor substrate 81 (hereinafter, referred to as a silicon substrate 81) constituted with, for example, silicon (Si). The control circuit 22 and the logic circuit 23 in FIGS. 2A and 2B are constituted with this multi-layer wiring layer 82.

The multi-layer wiring layer 82 is constituted with a plurality of wiring layers 83 including an uppermost wiring layer 83a closest to the pixel sensor substrate 12, an intermediate wiring layer 83b, a lowermost wiring layer 83c closest to the silicon substrate 81, and the like, and an interlayer dielectric 84 formed between the respective wiring layers 83.

The plurality of wiring layers 83 is formed using, for example, copper (Cu), aluminum (Al), tungsten (W), or the like, and the interlayer dielectric 84 is formed with, for example, a silicon oxide film, a silicon nitride film, or the like. All the layers of the plurality of wiring layers 83 and the interlayer dielectric 84 may be formed with the same material or two or more materials may be used depending on layers.

A silicon through hole 85 which penetrates through the silicon substrate 81 is formed at a predetermined position of the silicon substrate 81. Further, by a connection conductor 87 being embedded into the silicon through hole 85 via the insulating film 86, a through silicon via (TSV) 88 is formed. More specifically, in the through silicon via 88, the insulating film 86 and the connection conductor 87 are formed along an inner wall of the silicon through hole 85. Further, in the through silicon via 88, the connection conductor 87 is formed on a surface on a side of the silicon substrate 81 of the wiring layer 83c of the multi-layer wiring layer 82. That is, the inner wall and the bottom surface of the through silicon via 88 are covered with the connection conductor 87. Further, the connection conductor 87 of the through silicon via 88 is connected to the rewiring 90 formed on a side of a lower surface of the silicon substrate 81 (on a surface opposite to the surface on a side of the multi-layer wiring layer 82), and the rewiring 90 is connected to the solder ball 14.

Note that the insulating film 86 can be formed with, for example, an SiO2 film, an SiN film, or the like. The connection conductor 87 and the rewiring 90 can be formed with, for example, copper (Cu), tungsten (W), titanium (Ti), tantalum (Ta), an alloy of titanium and tungsten (TiW), polysilicon, or the like.

A lower surface of the silicon substrate 81 and an inside of the through silicon via 88 except a region where the solder ball 14 is formed, are covered with an insulating film including a solder mask (solder resist) 91 so as to cover the insulating film 86, the connection conductor 87 and the rewiring 90. The solder mask 91 has a two-layer structure of a solder mask 91A and a solder mask 91B. More specifically, the solder mask 91 has a two-layer structure of the solder mask 91A and the solder mask 91B on the lower surface of the silicon substrate 81 and on the inner wall of the through silicon via 88. Meanwhile, as will be described later, the solder mask 91 has a one-layer structure of the solder mask 91A in which the solder mask 91B is not laminated on the bottom surface of the through silicon via 88.

Further, in the through silicon via 88, a groove 88A which opens on a side of the lower surface of the silicon substrate 81, and which reaches the solder mask 91A on the bottom surface of the through silicon via 88 from the opening is formed. Therefore, in the through silicon via 88, the solder mask 91A and the solder mask 91B are laminated on the connection conductor 87 on the inner wall, and the solder mask 91A is laminated on the connection conductor 87 while the solder mask 91B is not laminated on the bottom surface (bottom of the groove 88A).

As will be described later, with this groove 88A, stress by swelling and contraction action of the solder mask 91 upon development is relaxed, and occurrence of a crack at the solder mask 91 around the through silicon via 88 is suppressed. As a result, it is, for example, possible to prevent degradation in quality and reliability of the solid-state imaging device 1 due to corrosion of the rewiring 90 by influence of moisture, or the like, as a result of the rewiring 90 being exposed due to a crack.

Note that, for example, on a surface of the rewiring 90, a thickness of the solder mask 91A and a thickness of the solder mask 91B are set at substantially the same thickness. Further, for example, a thickness of the solder mask 91A on the bottom surface of the through silicon via 88 is set at a thickness equal to or greater than a total thickness of the solder mask 91A and the solder mask 91B on the surface of the rewiring 90.

Further, the solder mask 91A and the solder mask 91B are formed with, for example, a positive photosensitive insulating material, or the like. Specifically, the solder mask 91A and the solder mask 91B can be formed with, for example, an SiO2 film, an SiN film, an SiON film, or the like. Note that it is also possible to form the solder mask 91A and the solder mask 91B with different materials.

Meanwhile, on the pixel sensor substrate 12, a multi-layer wiring layer 102 is formed on a lower side (side of the logic substrate 11) of the semiconductor substrate 101 (hereinafter, referred to as a silicon substrate 101) constituted with silicon (Si). A pixel circuit of the pixel region 21 in FIGS. 2A and 2B is constituted with this multi-layer wiring layer 102.

The multi-layer wiring layer 102 is constituted with a plurality of wiring layers 103 including an uppermost wiring layer 103a closest to the silicon substrate 101, an intermediate wiring layer 103b, a lowermost wiring layer 103c closest to the logic substrate 11, or the like, and an interlayer dielectric 104 formed between the respective wiring layers 103.

The same materials as the materials of the wiring layers 83 and the interlayer dielectric 84 described above may be employed as materials to be used as the plurality of wiring layers 103 and the interlayer dielectric 104. Further, the plurality of wiring layers 103 and the interlayer dielectric 104 are similar to the wiring layers 83 and the interlayer dielectric 84 described above in that one or two or more materials may be used.

Note that, while, in the example in FIG. 5, the multi-layer wiring layer 102 of the pixel sensor substrate 12 is constituted with a three-layer wiring layer 103, and the multi-layer wiring layer 82 of the logic substrate 11 is constituted with a three-layer wiring layer 83, the total number of wiring layers is not limited to this, and the multi-layer wiring layers may be formed with an arbitrary number of layers.

Photodiodes 51 formed through PN junction are formed for each pixel 32 within the silicon substrate 101.

Further, while illustration is omitted, a plurality of pixel transistors such as the first transfer transistor 52 and the second transfer transistor 54, the memory portion (MEM) 53, or the like, are formed on the multi-layer wiring layer 102 and the silicon substrate 101.

At a predetermined position of the silicon substrate 101 at which the color filter 15 and the on-chip lens 16 are not formed, a through silicon via 109 connected to the wiring layer 103a of the pixel sensor substrate 12, and a through silicon chip electrode 105 connected to the wiring layer 83a of the logic substrate 11 are formed.

The through silicon chip electrode 105 is connected to the through silicon via 109 with a connection wiring 106 formed on an upper surface of the silicon substrate 101. Further, an insulating film 107 is formed between each of the through silicon via 109 and the through silicon chip electrode 105, and the silicon substrate 101. Still further, on the upper surface of the silicon substrate 101, the color filter 15 and the on-chip lens 16 are formed via the insulating film (planarization film) 108.

As described above, the laminate substrate 13 of the solid-state imaging device 1 illustrated in FIG. 1 has a laminate structure in which the multi-layer wiring layer 82 side of the logic substrate 11 and the multi-layer wiring layer 102 side of the pixel sensor substrate 12 are pasted together. Note that, in FIG. 5, a pasting surface of the multi-layer wiring layer 82 of the logic substrate 11 and the multi-layer wiring layer 102 of the pixel sensor substrate 12 is indicated with a dashed line.

Further, at the laminate substrate 13 of the solid-state imaging device 1, the wiring layer 103 of the pixel sensor substrate 12 is connected to the wiring layer 83 of the logic substrate 11 with two through electrodes of the through silicon via 109 and the through silicon chip electrode 105, and the wiring layer 83 of the logic substrate 11 is connected to the solder ball (backside electrode) 14 with the through silicon via 88 and the rewiring 90. By this means, it is possible to reduce a plane area of the solid-state imaging device 1 as small as possible.

Further, by pasting the laminate substrate 13 to the glass protection substrate 18 with the glass seal resin 17 while realizing a cavity-less structure between the laminate substrate 13 and the glass protection substrate 18, it is also possible to make the solid-state imaging device 1 lower in a height direction.

Therefore, according to the solid-state imaging device 1 illustrated in FIG. 1, it is possible to realize a further smaller semiconductor device (semiconductor package).

Figure 6:
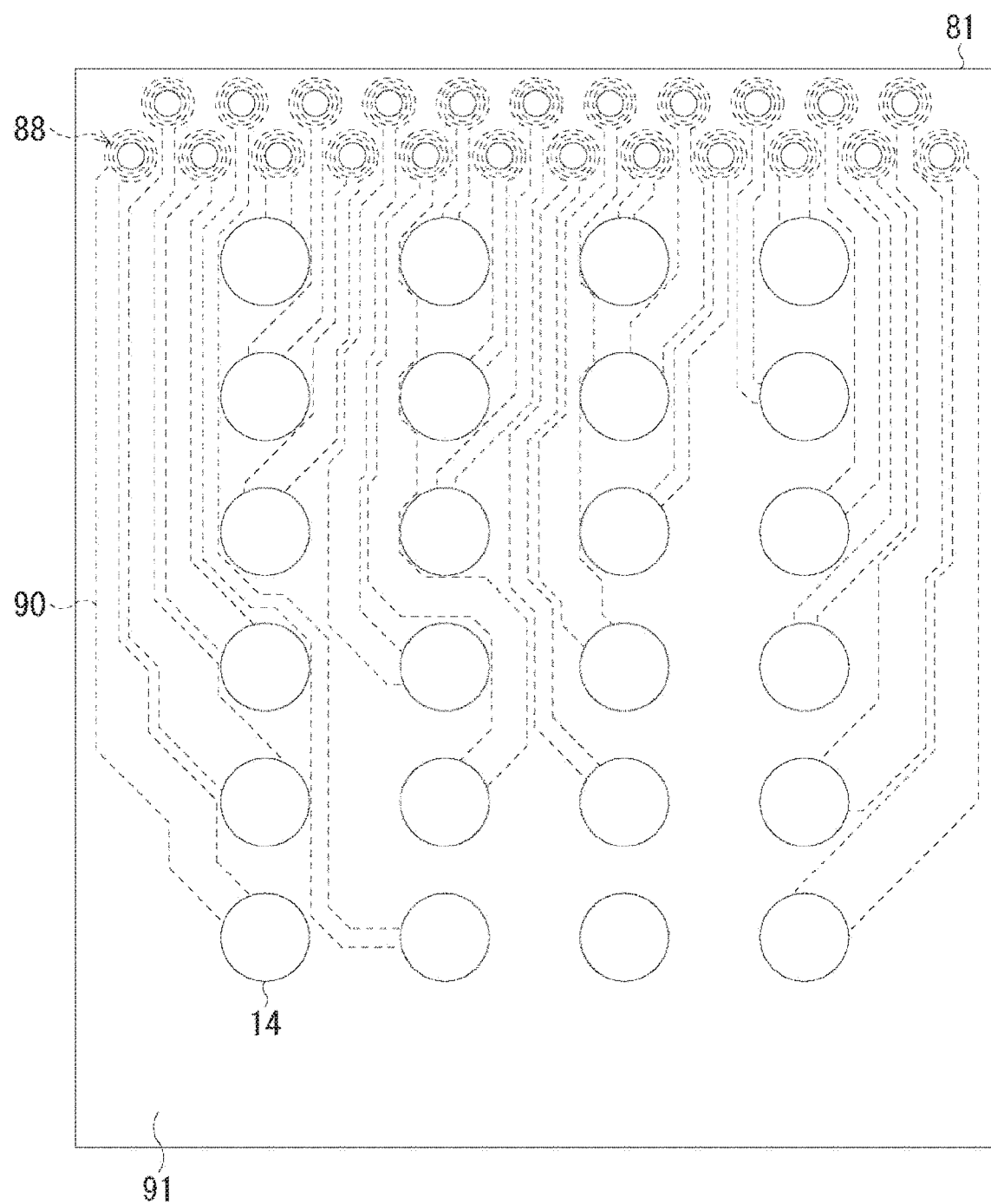
FIG. 6 is a view schematically illustrating an example of arrangement of solder balls, through silicon vias and rewirings.
Figure 7:
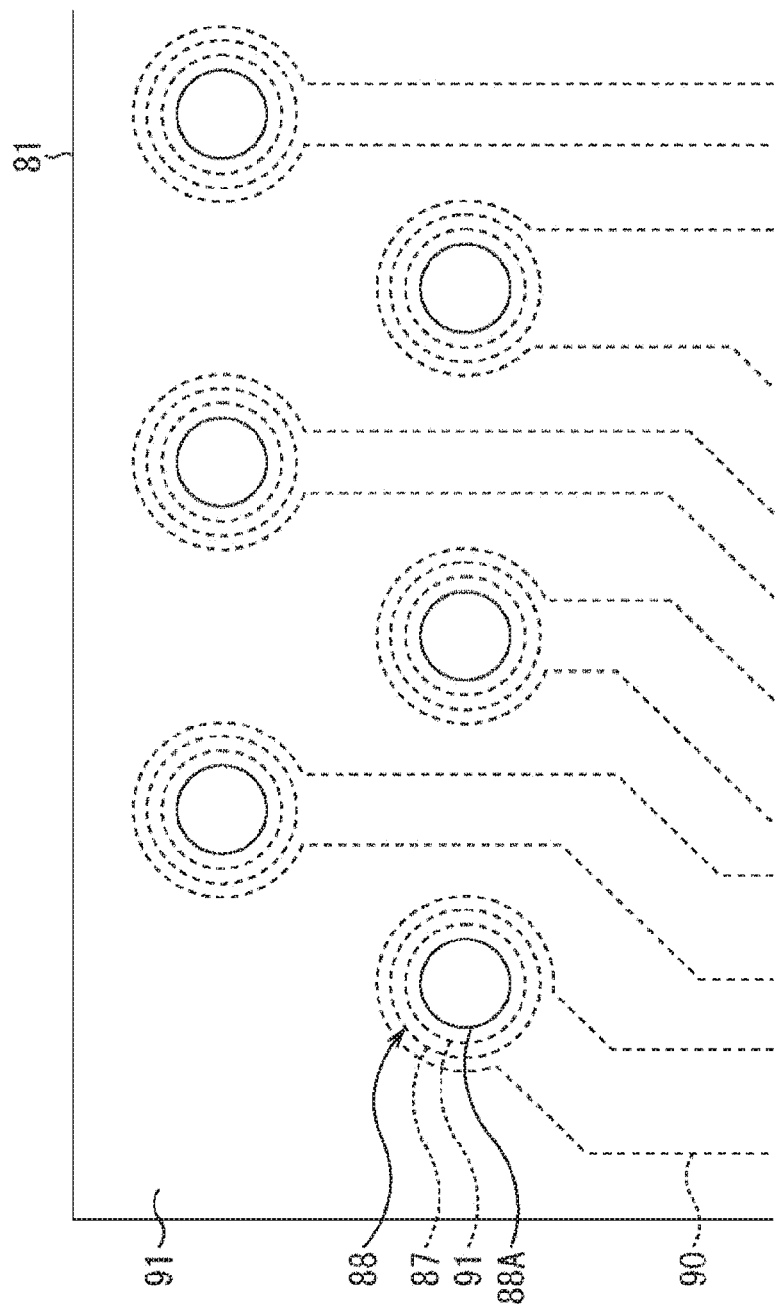
FIG. 7 is an enlarged view schematically illustrating a configuration of the through silicon via.

FIG. 6 schematically illustrates an example of arrangement of the solder balls 14, the through silicon vias 88 and the rewirings 90 on a lower surface of the silicon substrate 81 of the solid-state imaging device 1. FIG. 7 is an enlarged view of a portion in the vicinity of a region where the through silicon vias 88 are arranged in the silicon substrate 81 in FIG. 6. Note that, in FIG. 6 and FIG. 7, illustration of the insulating film 86 of the through silicon via 88 is omitted.

In this example, solder balls 14 are arranged in a grid shape of six rows vertically×four columns horizontally on the lower surface of the silicon substrate 81. Further, a plurality of through silicon vias 88 is arranged in two rows on an upper end of the silicon substrate 81 in the drawing. The respective through silicon vias 88 are connected to respectively different solder balls 14 via the rewirings 90. Further, the lower surface of the silicon substrate 81 except a region where the solder balls 14 are formed and a region where grooves 88A of the respective through silicon vias 88 are formed, is covered with the solder mask 91.

<Manufacturing Method of Solid-State Imaging Device>

Figure 10:
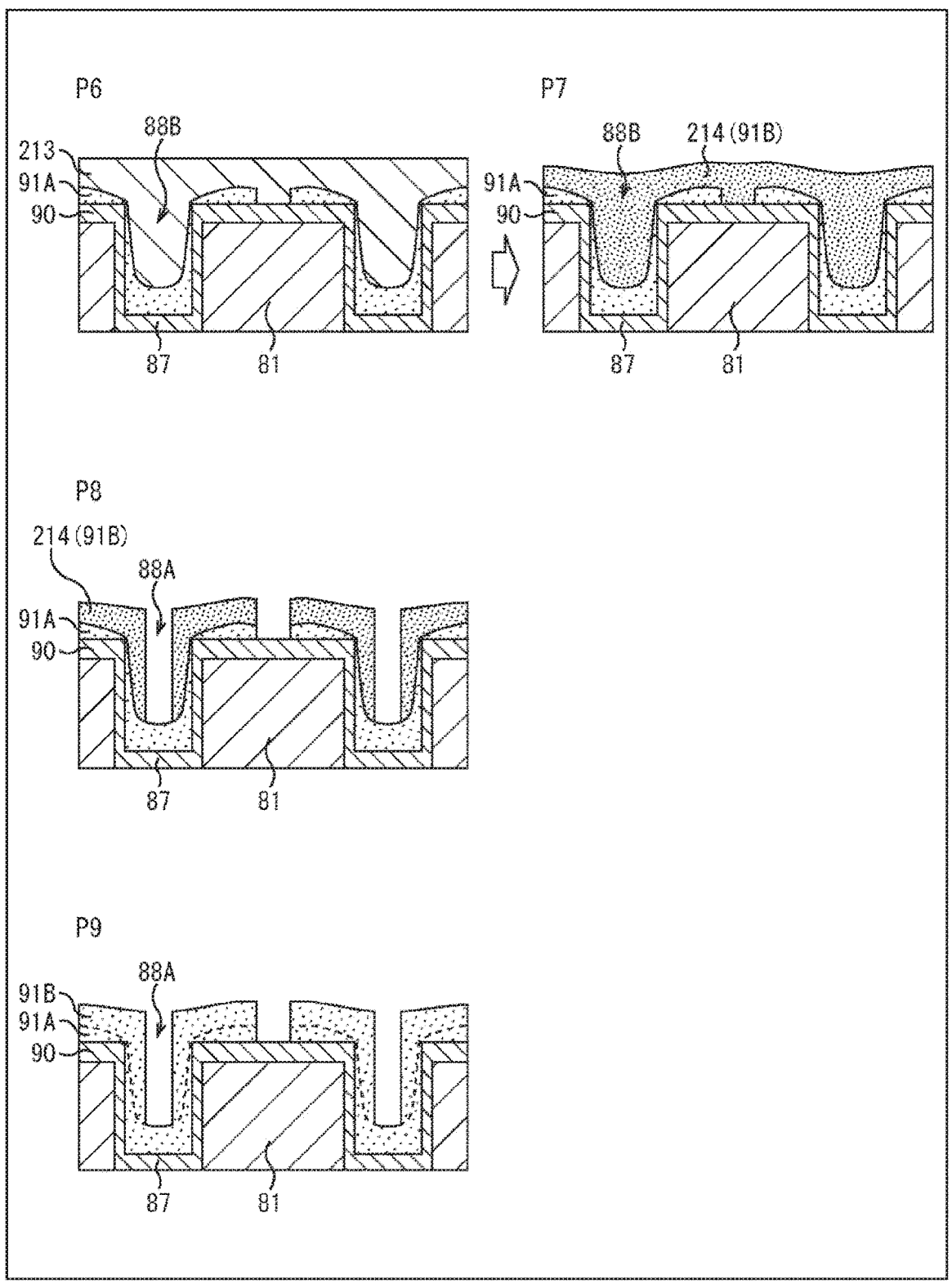
FIG. 10 is a view for explaining a manufacturing method of a semiconductor device.

Next, particularly, a method for forming the solder mask 91 among the manufacturing method of the solid-state imaging device 1 will be described with reference to FIG. 8 to FIG. 10. Note that, on a lower side of FIG. 8, in FIG. 9 and in FIG. 10, only a portion around the through silicon via 88 of the silicon substrate 81 among the solid-state imaging device 1 is illustrated. Further, illustration of the insulating film 86 is omitted in FIG. 8 to FIG. 10.

In step P1, pre-wetting processing is performed. Specifically, the solid-state imaging device 1 or a wafer on which a plurality of solid-state imaging devices 1 is formed is set at a spin chuck 201 of a coater device so that the lower surface of the silicon substrate 81 faces a direction of a nozzle 202. In this event, the rewiring 90 is formed on the lower surface of the silicon substrate 81 of the solid-state imaging device 1, and the insulating film 86 (not illustrated) and the connection conductor 87 are formed within the groove 88B of the through silicon via 88.

Figure 8:
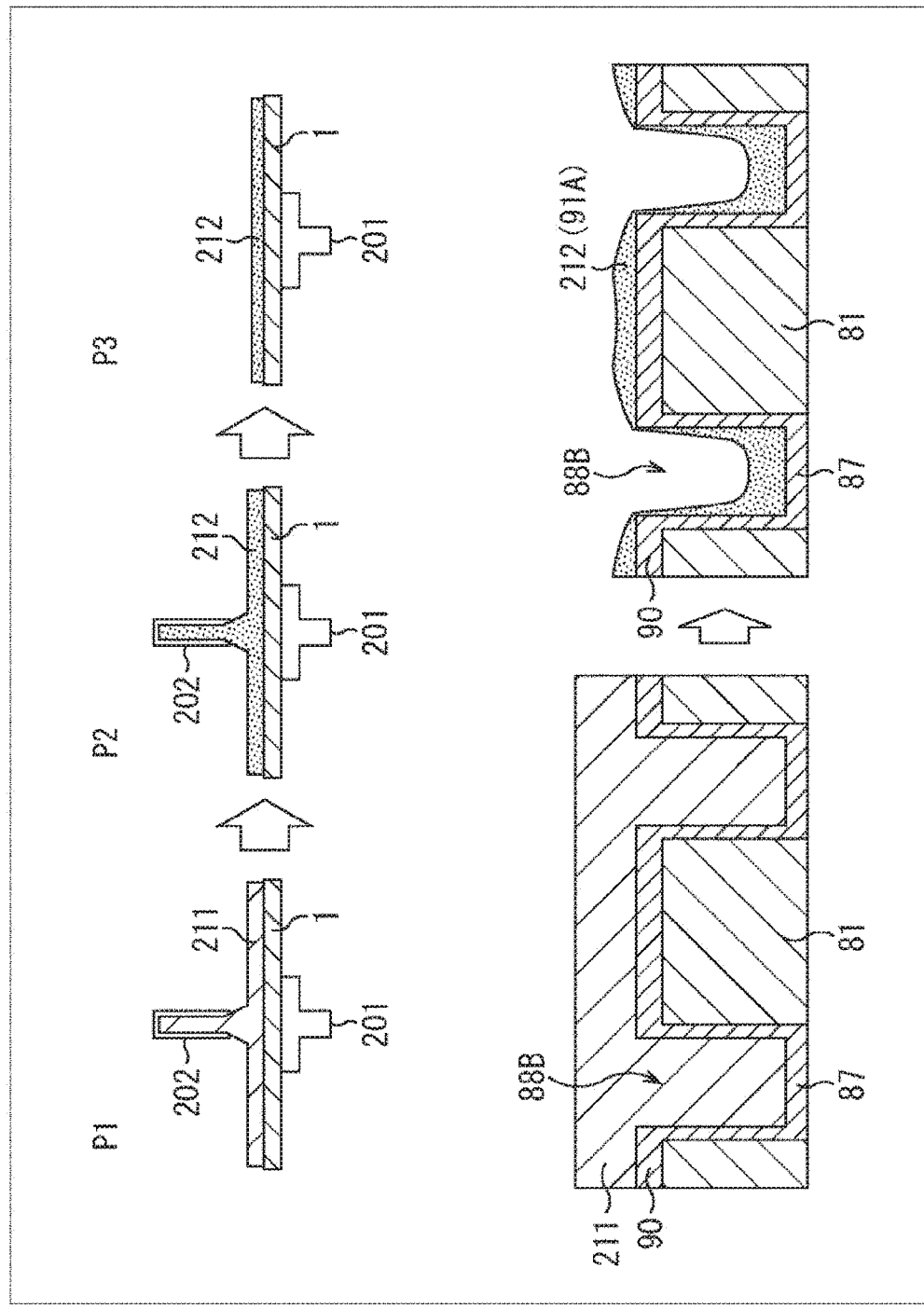
FIG. 8 is a view for explaining a manufacturing method of a semiconductor device.

Then, by thinner 211 being caused to drop from the nozzle 202 while the solid-state imaging device 1 is made to rotate by the spin chuck 201, as illustrated in a lower left portion in FIG. 8, the thinner 211 is applied on the entire lower surface of the silicon substrate 81. In this event, inside of the groove 88B of the through silicon via 88 is filled with the thinner 211. By this means, viscosity of the resin 212 which constitutes the solder mask 91A is lowered, and the resin 212 is easily embedded into the groove 88B. Note that, for example, a positive photosensitive insulating material is used as the resin 212.

In step P2, coating processing is performed. Specifically, by the resin 212 being caused to drop from the nozzle 202 while the solid-state imaging device 1 is caused to rotate by the spin chuck 201, the resin 212 is applied on the entire lower surface of the silicon substrate 81. In this event, a temperature of the resin 212 is managed at a predetermined value (for example, 23° C.)

This step P2 is performed mainly for the purpose of covering the connection conductor 87 on the bottom surface of the groove 88B of the through silicon via 88 with the resin 212, and a thickness of the resin 212 at other portions may be thin. However, the thickness of the resin 212 is adjusted so as to avoid the groove 88B from being clogged by the resin 212. For example, rotation speed of the spin chuck 201 is adjusted so that the thickness of the resin 212 on the lower surface of the silicon substrate 81 becomes a predetermined value (for example, approximately, 10 μm). By this means, for example, the thickness of the resin 212 on the bottom surface of the groove 88B of the silicon substrate 81 becomes approximately 20 to 40 μm.

In step P3, film forming processing is performed.

Specifically, first, post applied bake (PAB) processing is performed for a predetermined period (for example, 180 seconds) at a predetermined temperature (for example, 110° C.). As a result of this PAB processing, the thinner 211 which remains inside the resin 212 is removed.

Then, the solid-state imaging device 1 is put into a plate whose temperature is set at a predetermined temperature (for example, 23° C.), and is cooled for a predetermined period (for example, 60 seconds).

In step P4, pattern generation processing is performed.

Specifically, first, exposure of a predetermined pattern is performed on the resin 212 using an exposure device. For example, to remove the resin 212 in a region where the solder ball 14 is to be formed, the region is exposed. For example, an exposure period is 500 milliseconds, and focus is set at +6.25 μm. During this exposure, inside of the groove 88B of the through silicon via 88 is not exposed.

Then, post exposure bake (PEB) processing is performed for a predetermined period (for example, 180 seconds) at a predetermined temperature (for example, 110° C.). This PEB processing encourages cross-linking of the resin 212.

Then, the solid-state imaging device 1 is put into a plate whose temperature is set at a predetermined temperature (for example, 23° C.), and is cooled for a predetermined period (for example, 60 seconds).

Then, development processing is performed. For example, a developer obtained by diluting tetramethylammonium hydroxide (TMAH) by 2.38% is used for development. Further, a developing period is set at, for example, 60 seconds×twice. Through this processing, for example, the resin 212 in the region where the solder ball 14 is to be formed on the lower surface of the silicon substrate 81 is removed.

In step P5, oven processing (curing processing) is performed. This oven processing is performed, for example, for two hours at 120° C. and for one hour at 200° C. By this means, the resin 212 is cured and the solder mask 91A which exhibits insolubility to a thinner solvent, or the like, is formed.

In step P6, pre-wetting processing similar to that in step P1 is performed. By this means, the thinner 213 is applied on the entire surface of the solder mask 91A of the silicon substrate 81. Further, inside of the groove 88B of the through silicon via 88 is filled with the thinner 213.

In step P7, the coating processing and the film forming processing similar to those in step P2 and step P3 are performed. By this means, a resin 214 which is formed with similar members as those of the resin 212 is applied on the whole surface of the solder mask 91A of the silicon substrate 81, and the groove 88B of the through silicon via 88 is filled with the resin 214.

In step P8, pattern generation processing similar to that in step P4 is performed. However, in step P8, a pattern different from that in step P4 is generated. That is, as well as the resin 214 in the region where the solder ball 14 is to be formed being removed, the resin 214 at the center of the through silicon via 88 is removed in a groove shape (clipped). By this means, the groove 88A is formed within the through silicon via 88. A circumference of this groove 88A is enclosed by the resin 214, and the groove 88A reaches the solder mask 91A on the bottom surface of the through silicon via 88 from the lower surface of the silicon substrate 81 of the through silicon via 88. Further, for example, in a case where an inner diameter of an opening of the connection conductor 87 (inner diameter of the groove 88B in FIG. 8) on the lower surface of the silicon substrate 81 is set at 60 μm, an inner diameter of the groove 88A is set at 10 to 30 μm.

If the groove 88A is not formed, there is a possibility that the resin 214 within the through silicon via 88 is not completely cured even if the resin 214 on the lower surface of the silicon substrate 81 is completely cured in the PEB processing before development, due to a thickness difference between the resin 214 on the lower surface of the silicon substrate 81 and the resin 214 within the through silicon via 88. Further, there is a possibility that stress for drawing the resin inside the through silicon via 88 remains in the resin 214, and a crack may occur at the resin 214 around the through silicon via 88 upon development.

Meanwhile, by part of the resin 214 inside the through silicon via 88 being removed upon development, and the groove 88A being formed, stress by swelling and contraction action of the resin 214 which occurs upon development is relaxed. As a result, occurrence of a crack at the resin 214 around the through silicon via 88 is prevented. As a result, quality and reliability of the solid-state imaging device 1 is improved.

In step P9, oven processing (curing processing) similar to that in step P5 is performed. By this means, the resin 214 is cured, and the solder mask 91B which exhibits insolubility to a thinner solvent, or the like, is formed.

This solder mask 91B of the second layer is formed mainly for the purpose of supplementing the solder mask 91A of the first layer on the inner wall of the through silicon via 88 and on the lower surface of the silicon substrate 81. By this means, the thickness of the entire solder mask 91 increases on the inner wall of the through silicon via 88 and on the lower surface of the silicon substrate 81, so that the region is sufficiently covered.

Note that the thickness of the solder mask 91A is preferably substantially the same as the thickness of the solder mask 91B on a surface of the rewiring 90 on the lower surface of the silicon substrate 81.

The solder mask 91 is formed at the solid-state imaging device 1 as described above.

«2. Second Embodiment»

A second embodiment of the present technology will be described next with reference to FIG. 11.

Figure 11:
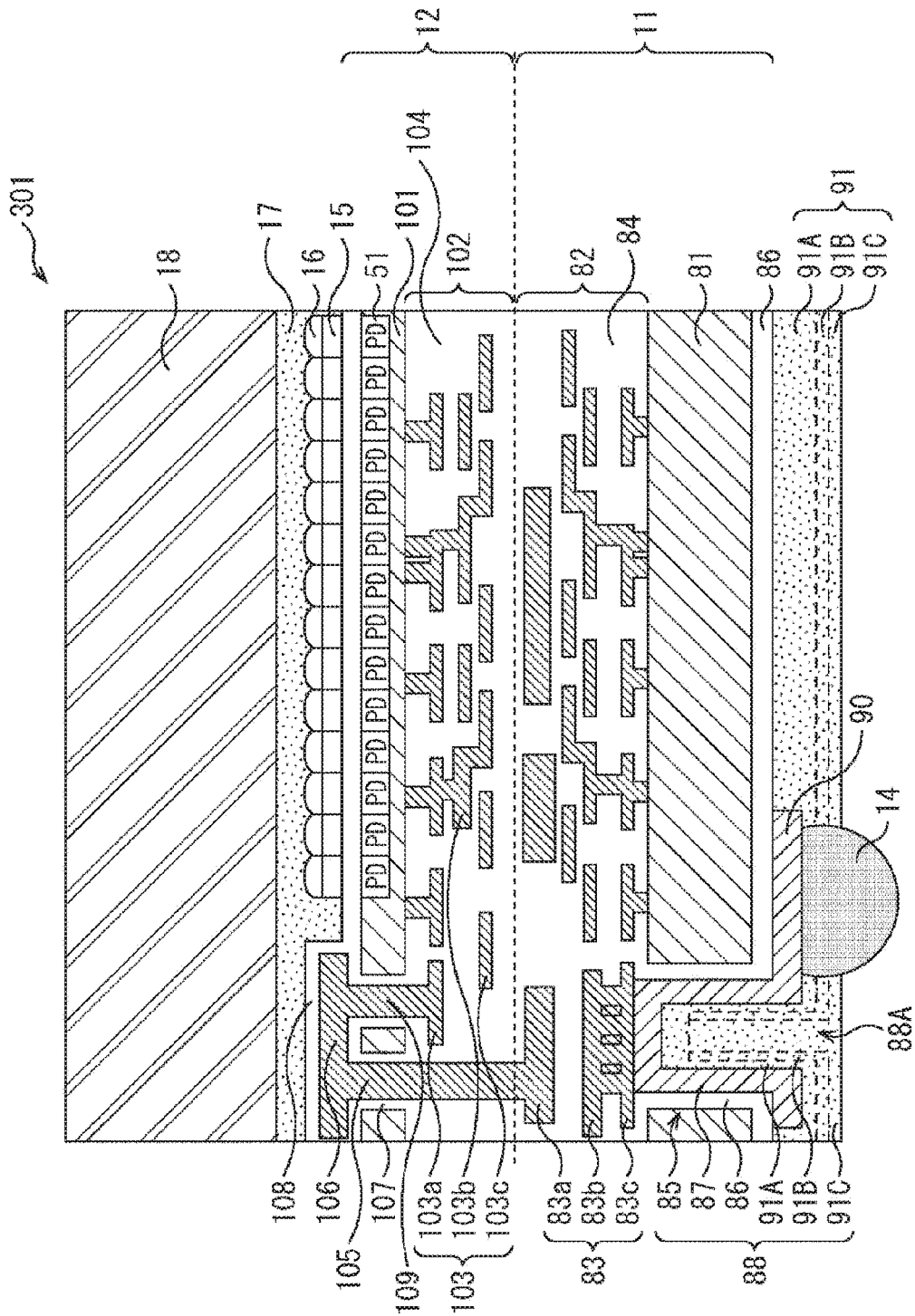
FIG. 11 is a view illustrating a detailed structure of a laminate substrate of a solid-state imaging device of a second embodiment.

FIG. 11 illustrates a configuration example of a solid-state imaging device 301 as a semiconductor device according to the second embodiment of the present technology. FIG. 11 is a cross-sectional enlarged view of a portion of the solid-state imaging device 301 in a similar manner to FIG. 5, and the same reference numerals are assigned to portions corresponding to those in the solid-state imaging device 1 in FIG. 5, and description thereof will be omitted as appropriate.

The solid-state imaging device 301 differs from the solid-state imaging device 1 in a configuration of the solder mask 91. That is, in the solid-state imaging device 301, the solder mask 91 has a three-layer structure by a solder mask 91C being added. Specifically, the solder mask 91C is laminated on the solder mask 91B. Further, the solder mask 91C clogs the groove 88A of the through silicon via 88 of the solid-state imaging device 1.

Note that the solder mask 91C is, for example, formed through steps similar to those for the solder mask 91A and the solder mask 91B. Because the solder mask 91A and the solder mask 91B have already been cured, a crack does not occur at the solder mask 91A and the solder mask 91B upon development of the solder mask 91C.

Further, the solder mask 91C only requires to clog at least an opening of the groove 88A of the through silicon via 88, and there may be a void inside the groove 88A.

«3. Application Examples»

Application examples of the present technology will be described next.

Figure 12:
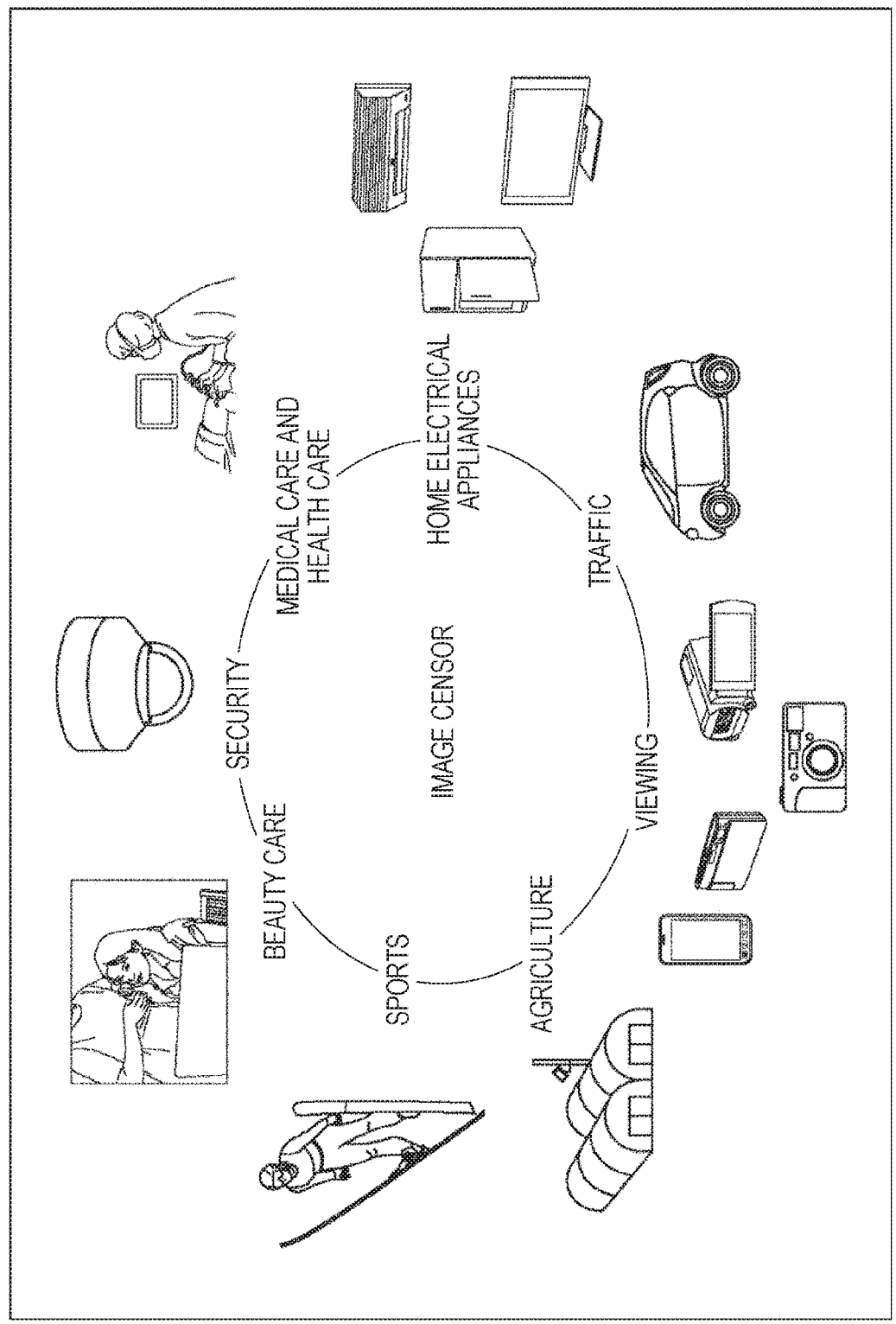
FIG. 12 is a view illustrating an application example of the present technology.

The present technology can be applied to, for example, as illustrated in FIG. 12, various cases in which light such as visible light, infrared light, ultraviolet light, or X-rays is detected.

- Devices that take images used for viewing, such as a digital camera and a portable appliance with a camera function.
- Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.
- Devices used for home electrical appliances, such as a TV, a refrigerator, and an air conditioner, to take images of a gesture of a user and perform appliance operation in accordance with the gesture.
- Devices used for medical care and health care, such as an endoscope and a device that performs angiography by reception of infrared light.
- Devices used for security, such as a monitoring camera for crime prevention and a camera for personal authentication.
- Devices used for beauty care, such as skin measurement equipment that takes images of the skin and a microscope that takes images of the scalp.
- Devices used for sports, such as an action camera and a wearable camera for sports and the like.

Devices used for agriculture, such as a camera for monitoring the condition of the field and crops.

<Application Example to Electronic Equipment>

For example, the present technology can be applied to general electronic equipment in which a solid-state imaging device is used at an image capturing unit (photoelectric converting unit) such as an imaging device such as a digital still camera and a video camera, a mobile terminal device having an imaging function, and a copier in which a solid-state imaging device is used at an image reading unit, as well as the solid-state imaging device.

Figure 13:
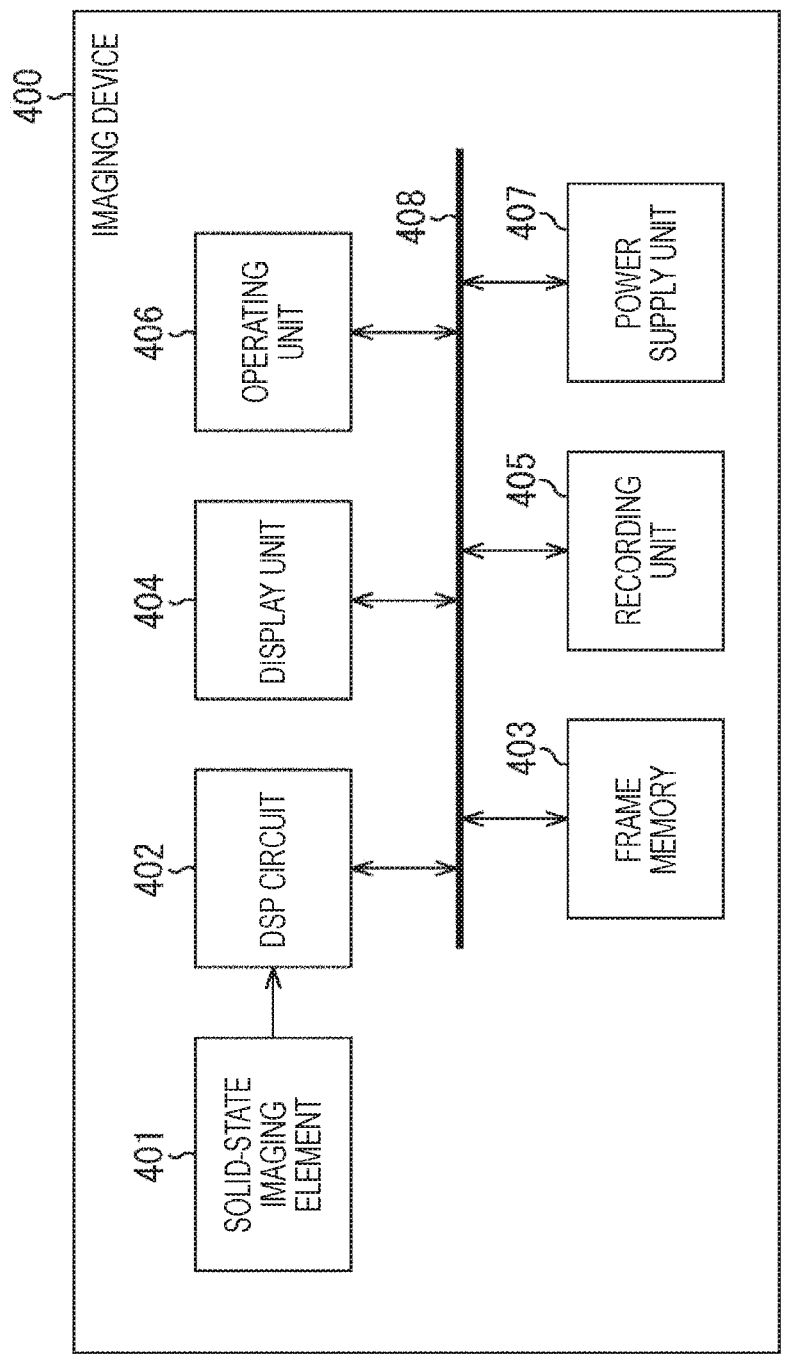
FIG. 13 is a block diagram illustrating a configuration example of electronic equipment.

FIG. 13 is a block diagram illustrating a configuration example of an imaging device as the electronic equipment according to the present technology.

The imaging device 400 in FIG. 13 includes a solid-state imaging device 401 which employs the configuration of the solid-state imaging device 1 in FIG. 1 or the solid-state imaging device 301 in FIG. 11, and a digital signal processor (DSP) circuit 402 which is a camera signal processing circuit. Further, the imaging device 401 also includes a frame memory 403, a display unit 404, a recording unit 405, an operating unit 406 and a power supply unit 407. The DSP circuit 402, the frame memory 403, the display unit 404, the recording unit 405, the operating unit 406 and the power supply unit 407 are connected to each other via a bus line 408.

The solid-state imaging device 401 captures incident light (image light) from a subject, converts a light amount of the incident light imaged on an imaging area into an electrical signal in units of pixel and outputs the electrical signal as a pixel signal. As this solid-state imaging device 401, the solid-state imaging device 1 in FIG. 1 or the solid-state imaging device 301 in FIG. 11 can be used.

The display unit 404 is, for example, formed with a panel type display device such as a liquid crystal panel and an organic electro luminescence (EL) panel, and displays a moving image or a still image captured at the solid-state imaging device 401. The recording unit 405 records a moving image or a still image captured at the solid-state imaging device 401 in a recording medium such as a hard disk and a semiconductor memory.

The operating unit 406 issues an operation command for various functions of the imaging device 400 under operation by a user. The power supply unit 407 supplies various kinds of power supplies which become operation power supplies of the DSP circuit 402, the frame memory 403, the display unit 404, the recording unit 405 and the operating unit 406, to these supply targets as appropriate.

As described above, by using the solid-state imaging device 1 in FIG. 1 or the solid-state imaging device 301 in FIG. 11 as the solid-state imaging device 401, it is possible to make a device smaller while realizing high sensitivity by expanding areas of photodiodes. It is therefore possible to realize both reduction in a size of a semiconductor package and improvement in image quality of a captured image also in the imaging device 400 such as a video camera, a digital still camera, and further, a camera module for mobile equipment such as a mobile phone.

Further, because occurrence of a crack at the solder mask of the solid-state imaging device 401 is suppressed, quality and reliability of the solid-state imaging device 401 are improved, which results in improvement of quality and reliability of the imaging device 400 including the solid-state imaging device 401.

<Application Example to Endoscopic Surgery System>

Further, for example, the present disclosure technology may be applied to the endoscopic surgery system.

Figure 14:
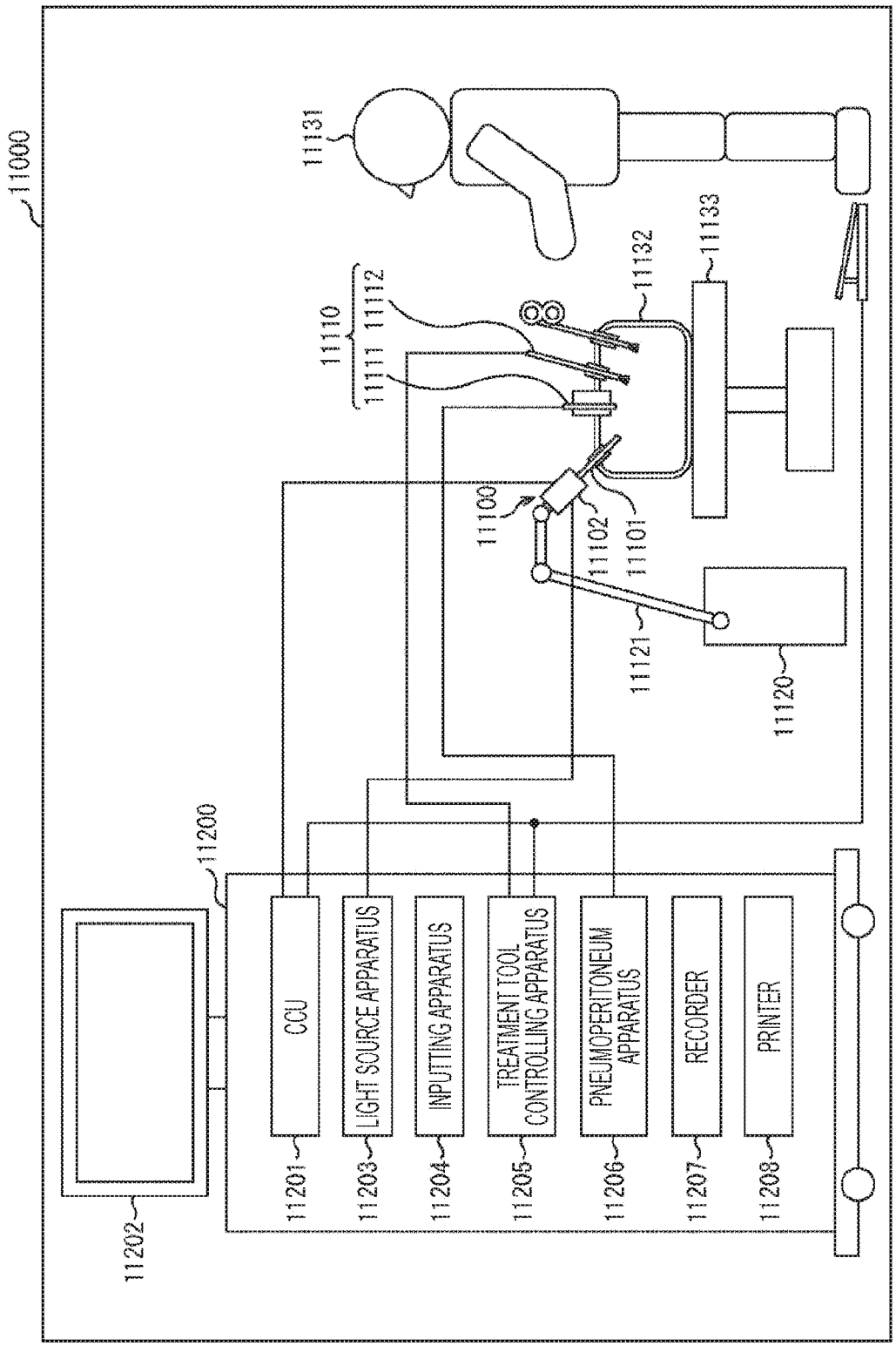
FIG. 14 is a view depicting an example of a schematic configuration of an endoscopic surgery system.

FIG. 14 is a view depicting an example of a schematic configuration of an endoscopic surgery system to which the technology according to an embodiment of the present disclosure (present technology) can be applied.

In FIG. 14, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which is included as a rigid endoscope having the lens barrel 11101 of the hard type. However, the endoscope 11100 may otherwise be included as a flexible endoscope having the lens barrel of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a camera control unit (CCU) 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region and the like to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or the like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings, it is also possible to time-divisionally capture images corresponding to respective R, G and B. According to the method just described, a color image can be obtained even if a color filter is not provided for the imaging element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrower wavelength band in comparison with irradiation light upon ordinary observation (namely, white light), so-called narrow band light observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue, for example. The light source apparatus 11203 can be configured to supply such narrowband light and/or excitation light suitable for special light observation as described above.

Figure 15:
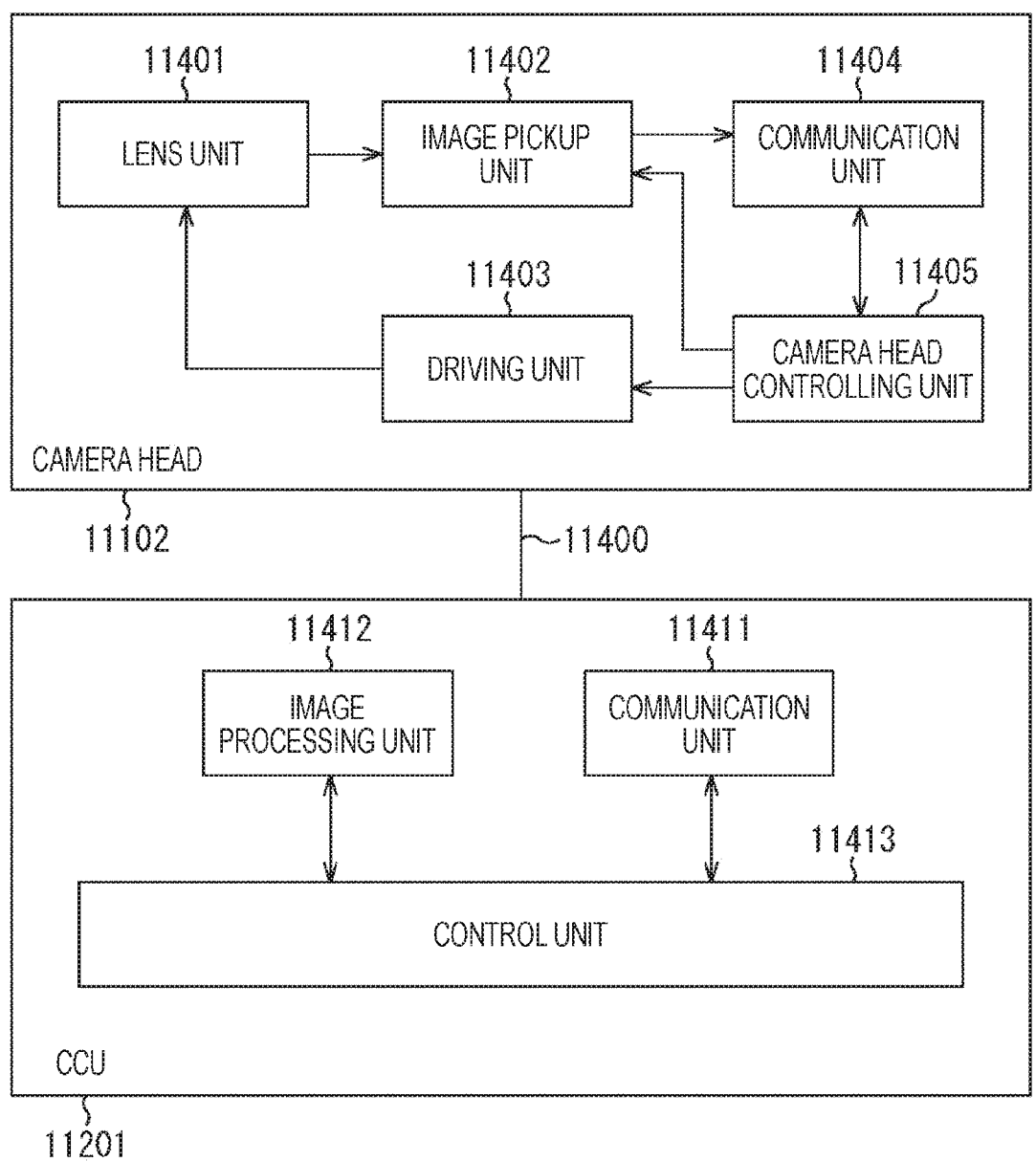
FIG. 15 is a block diagram depicting an example of a functional configuration of a camera head and a camera control unit (CCU).

FIG. 15 is a block diagram depicting an example of a functional configuration of the camera head 11102 and the CCU 11201 depicted in FIG. 14.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes image pickup elements. The number of image pickup elements which is included by the image pickup unit 11402 may be one (so-called single-plate type) or a plural number (so-called multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, in a case where the image pickup unit 11402 is configured as that of multi-plate type, a plurality of systems of lens units 11401 is provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to imaging conditions such as, for example, information by which a frame rate of a picked up image is designated, information by which an exposure value upon image picking up is designated and/or information by which a magnification and a focal point of a picked up image are designated.

It is to be noted that the image pickup conditions such as the frame rate, exposure value, magnification or focal point may be appropriately designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The above description describes an example of an endoscopic surgery system to which the technology according to the present disclosure can be applied. For example, the technology according to the present disclosure can be applied to the image pickup unit 11402 of the camera head 11102, and the like, of the constituent elements described above. Specifically, the solid-state imaging device 1 of FIG. 1 or the solid-state imaging device 301 of FIG. 11 can be applied to the image pickup unit 10402, for example. When the technology according to the present disclosure is applied to the image pickup unit 10402, quality and reliability of the image pickup unit 10402 are improved, which results in improvement of quality and reliability of the entire endoscopic surgery system 11000 including the image pickup unit 10402.

Note that, here, an endoscopic surgery system is described as an example, but the technology according to the present disclosure may be applied to other systems such as a microsurgery system, for example.

<Application Example to Mobile Body>

Further, for example, the technology according to the present disclosure may also be realized as a device mounted in a mobile body of any type such as automobile, electric vehicle, hybrid electric vehicle, motorcycle, bicycle, personal mobility, airplane, drone, ship, or robot.

Figure 16:
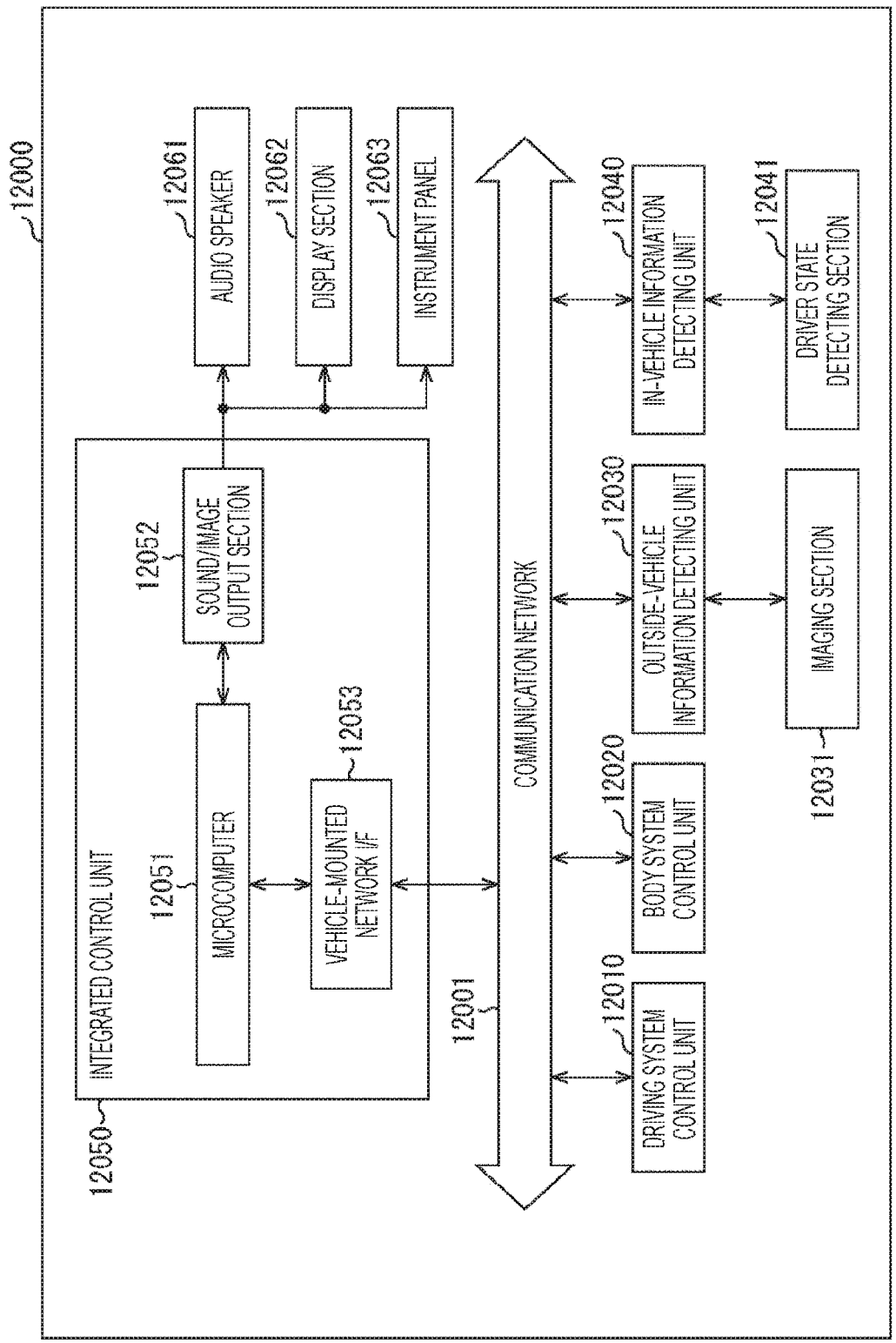
FIG. 16 is a block diagram depicting an example of schematic configuration of a vehicle control system.

FIG. 16 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 16, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the surroundings of the vehicle which is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In the example of FIG. 16, an audio speaker 12061, a display section 12062, and an instrument panel 12063 are illustrated as the output device. The display section 12062 may, for example, include at least one of an on-board display and a head-up display.

Figure 17:
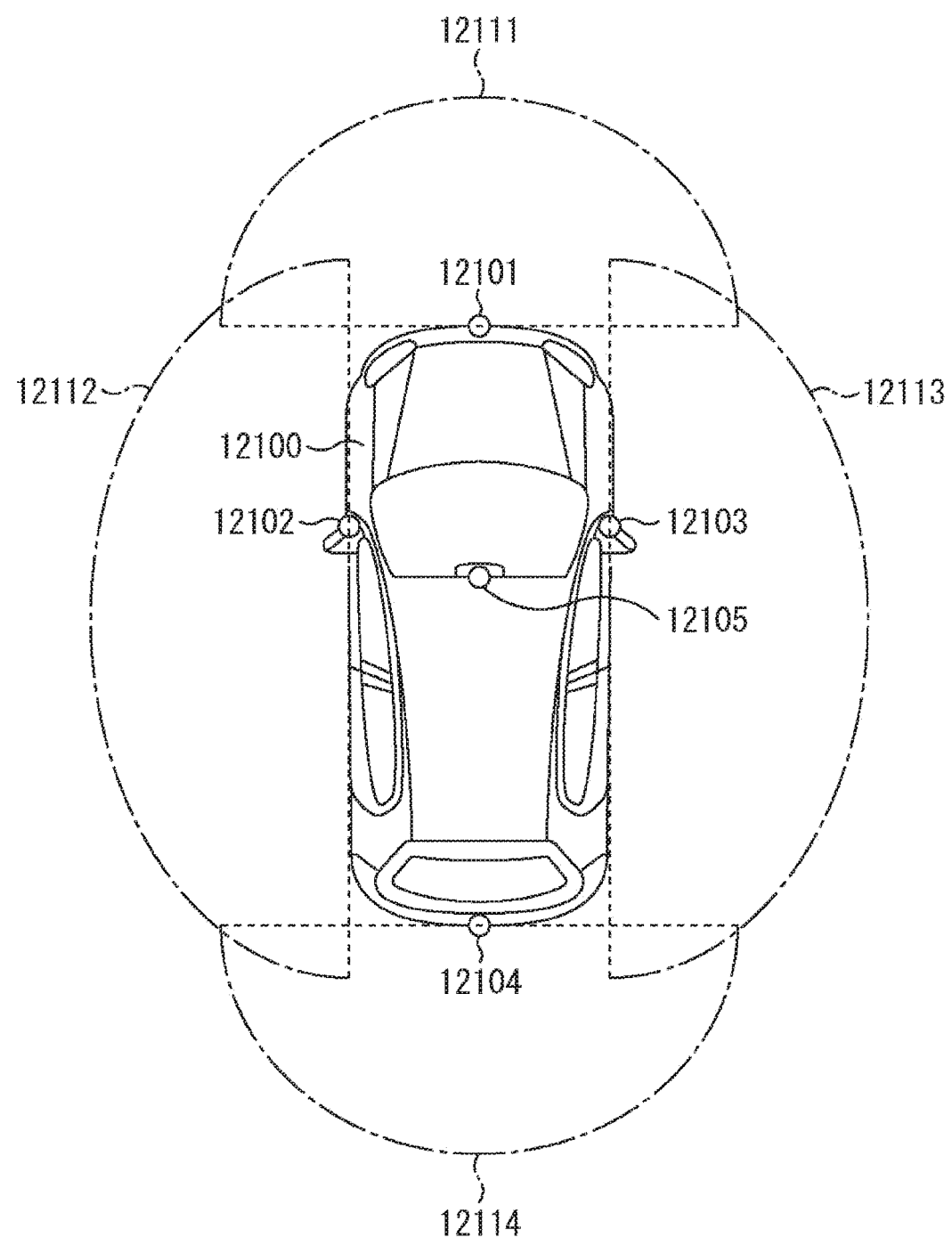
FIG. 17 is a diagram of assistance in explaining an example of installation positions of an outside-vehicle information detecting section and an imaging section.

FIG. 17 is a diagram depicting an example of the installation position of the imaging section 12031.

In FIG. 17, the vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, a back door of the vehicle 12100 as well as a position on an upper portion of a windshield within the interior of the vehicle, and the like. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The images of the front obtained by the imaging sections 12101 and 12105 are used mainly to detect a preceding vehicle, a pedestrian, an obstacle, a signal, a traffic sign, a lane, or the like.

Incidentally, FIG. 17 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object.

When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. In addition, the sound/image output section 12052 may also control the display section 12062 so that an icon or the like representing the pedestrian is displayed at a desired position.

The above description describes an example of a vehicle control system to which the technology according to the present disclosure can be applied. The technology according to the present disclosure can be applied to, for example, the imaging section 12031 of the constituent elements described above. Specifically, the solid-state imaging device 1 of FIG. 1 or the solid-state imaging device 301 of FIG. 11 can be applied to the imaging section 12031, for example. When the technology according to the present disclosure is applied to the imaging section 12031, quality and reliability of the imaging section 12031 are improved, which results in improvement of quality and reliability of the entire vehicle control system 12000 including the imaging section 12031.

«4. Modified Examples»

Modified examples of the above-described embodiments of the present technology will be described below.

For example, all of the solder mask 91 of the second layer is not necessarily removed on the bottom surface of the through silicon via 88, and part of the solder mask 91 may be left.

Further, while, in the above-described examples, examples have been described where the present technology is applied to a backside irradiation type solid-state imaging device, the present technology can be also applied to a surface irradiation type solid-state imaging device.

Still further, the present technology can be applied to a semiconductor device including a through electrode which penetrates through a semiconductor substrate such as silicon, and electronic equipment including the semiconductor device, in addition to the solid-state imaging device.

Note that the embodiments of the present disclosure are not limited to the above-described embodiments, and various changes can be made within a scope not deviating from the gist of the present disclosure.

For example, it is possible to employ an embodiment in which all or part of the above-described plurality of embodiments are combined.

Note that effects described in the present specification are merely examples, and the effects are not limited to the effects described in the present specification. There may be effects other than those described in the present specification.

Additionally, the present technology may also be configured as below.

(1)

A semiconductor device including:

a first semiconductor substrate including a through electrode;

a first insulating film laminated on a first surface of the first semiconductor substrate; and a second insulating film laminated on the first insulating film, in which an inner wall and a bottom surface of the through electrode are covered with a conductor, the first insulating film and the second insulating film are laminated on the conductor, and the through electrode includes a groove which reaches the first insulating film on the bottom surface from the first surface of the first semiconductor substrate.

(2)

The semiconductor device according to (1), in which, in the through electrode, the first insulating film and the second insulating film are laminated on the conductor on the inner wall, and the first insulating film is laminated on the conductor, while the second insulating film is not laminated at least at a bottom of the groove on the bottom surface.

(3)

The semiconductor device according to (1) or (2), in which a first wiring connected to the conductor is provided on the first surface of the first semiconductor substrate.

(4)

The semiconductor device according to (3), in which a thickness of the first insulating film on the bottom surface of the through electrode is equal to or greater than a total thickness of a thickness of the first insulating film and a thickness of the second insulating film on a surface of the first wiring.

(5)

The semiconductor device according to (3) or (4), in which a thickness of the first insulating film is substantially same as a thickness of the second insulating film on the surface of the first wiring.

(6)

The semiconductor device according to any one of (3) to (5), further including:

a solder ball provided at a portion of the first wiring, which is not covered with the first insulating film and the second insulating film.

(7)

The semiconductor device according to any one of (1) to (6), in which the first insulating film and the second insulating film are formed with a same material.

(8)

The semiconductor device according to any one of (1) to (7), further including:
   a third insulating film which is laminated on the second insulating film and which clogs an opening of the groove.

(9)

The semiconductor device according to any one of (1) to (8), further including:
   a wiring layer laminated on a second surface which is opposite to the first surface of the first semiconductor substrate,
   in which the conductor on the bottom surface of the through electrode is connected to a second wiring in the wiring layer.

(10)

The semiconductor device according to (9), further including:
   a second semiconductor substrate which includes a pixel portion which performs photoelectric conversion, and which is laminated on a surface of the wiring layer, opposite to a surface on a side of the first semiconductor substrate.

(11)

A manufacturing method of a semiconductor device, including:
   a first step of forming a first insulating film on a predetermined surface of a semiconductor substrate and on a conductor which covers an inner wall and a bottom surface of a through electrode of the semiconductor substrate;
   a second step of forming a second insulating film on the first insulating film; and
   a third step of forming a groove which reaches the first insulating film on the bottom surface of the through electrode from the predetermined surface of the semiconductor substrate, within the through electrode.

(12)

Electronic equipment including:
   a semiconductor device; and
   a signal processing unit configured to process a signal output from the semiconductor device,
   in which the semiconductor device includes:
      a first semiconductor substrate including a through electrode;
      a first insulating film laminated on a first surface of the first semiconductor substrate; and
      a second insulating film laminated on the first insulating film, and
      an inner wall and a bottom surface of the through electrode are covered with a conductor, the first insulating film and the second insulating film are laminated on the conductor, and the through electrode includes a groove which reaches the first insulating film on the bottom surface from the first surface of the first semiconductor substrate.

REFERENCE SIGNS LIST

1 Solid-state imaging device
11 Lower substrate (logic substrate)
12 Upper substrate (pixel sensor substrate)
13 Laminate substrate
14 Solder ball
21 Pixel region
22 Control circuit
23 Logic circuit
32 Pixel
51 Photodiode
81 Silicon substrate
83 Wiring layer
85 Silicon through hole
86 Insulating film
87 Connection conductor
88 Through silicon via
88A Groove
90 Rewiring
91, 91A to 91C Solder mask
101 Silicon substrate
301 Solid-state imaging device
400 Imaging device
401 Solid-state imaging device
402 DSP circuit

The invention claimed is:

1. A semiconductor device, comprising:
   a first semiconductor substrate including a through electrode, wherein the first semiconductor substrate includes:
      a first surface, wherein a wiring layer is on the first surface; and
      a second surface opposite to the first surface, wherein a bottom surface of the through electrode is towards the first surface of the first semiconductor substrate;
   a first insulating film on the second surface of the first semiconductor substrate; and
   a second insulating film on the first insulating film, wherein
   an inner wall of the through electrode and the bottom surface of the through electrode are covered with a conductor,
   the first insulating film and the second insulating film are on the conductor in the through electrode, and
   the through electrode includes a groove which reaches the first insulating film on the bottom surface of the through electrode from the second surface of the first semiconductor substrate.

2. The semiconductor device according to claim 1, wherein
   in the through electrode, both the first insulating film and the second insulating film are on the conductor on the inner wall, and
   in the through electrode, the first insulating film is on the conductor at a bottom of the groove on the bottom surface of the through electrode while the second insulating film is not at least on the conductor at the bottom of the groove on the bottom surface of the through electrode.

3. The semiconductor device according to claim 1, wherein a first wiring connected to the conductor is provided on the second surface of the first semiconductor substrate.

4. The semiconductor device according to claim 3, wherein a thickness of the first insulating film on the bottom surface of the through electrode is equal to or greater than a total thickness of a thickness of the first insulating film and a thickness of the second insulating film on a surface of the first wiring on the second surface of the first semiconductor substrate.

5. The semiconductor device according to claim 3, wherein a thickness of the first insulating film is substantially same as a thickness of the second insulating film on a surface of the first wiring on the second surface of the first semiconductor substrate.

6. The semiconductor device according to claim 3, further comprising:
a solder ball at a portion of the first wiring on the second surface of the first semiconductor substrate, wherein the portion of the first wiring is not covered with the first insulating film and the second insulating film.

7. The semiconductor device according to claim 1, wherein the first insulating film and the second insulating film are of a same material.

8. The semiconductor device according to claim 1, further comprising:
a third insulating film on the second insulating film, wherein the third insulating film clogs an opening of the groove.

9. The semiconductor device according to claim 1, further comprising:
the wiring layer on the first surface of the first semiconductor substrate which is opposite to the second surface of the first semiconductor substrate,
wherein the conductor on the bottom surface of the through electrode is connected to a second wiring in the wiring layer.

10. The semiconductor device according to claim 9, further comprising:
a second semiconductor substrate which includes a pixel portion, wherein
the pixel portion is configured to perform photoelectric conversion, and
the pixel portion is on a surface of the wiring layer, opposite to a surface on a side of the first semiconductor substrate.

11. A manufacturing method of a semiconductor device, comprising:
forming a first insulating film on a first surface of a semiconductor substrate and on a conductor which covers an inner wall of a through electrode of the semiconductor substrate and a bottom surface of the through electrode of the semiconductor substrate, wherein
the first surface of the semiconductor substrate is opposite a second surface of the semiconductor substrate,
a wiring layer is on the second surface of the semiconductor substrate, and
the bottom surface of the through electrode is towards the second surface of the semiconductor substrate;
forming a second insulating film on the first insulating film on the conductor in the through electrode; and
forming a groove within the through electrode, wherein the groove reaches the first insulating film on the bottom surface of the through electrode from the first surface of the semiconductor substrate, within the through electrode.

12. An electronic equipment, comprising:
a semiconductor device; and
a signal processing unit configured to process a signal output from the semiconductor device,
wherein the semiconductor device includes:
a first semiconductor substrate including a through electrode, wherein the first semiconductor substrate includes:
a first surface, wherein a wiring layer is on the first surface; and
a second surface opposite to the first surface, wherein
a bottom surface of the through electrode is towards the first surface of the first semiconductor substrate;
a first insulating film on the second surface of the first semiconductor substrate; and
a second insulating film on the first insulating film, wherein
an inner wall of the through electrode and the bottom surface of the through electrode are covered with a conductor,
the first insulating film and the second insulating film are on the conductor in the through electrode, and
the through electrode includes a groove which reaches the first insulating film on the bottom surface of the through electrode from the second surface of the first semiconductor substrate.

* * * * *